United States Patent
Brewer et al.

(10) Patent No.: US 11,677,362 B2
(45) Date of Patent: Jun. 13, 2023

(54) RADIO FREQUENCY TRANSISTOR AMPLIFIERS HAVING MULTI-LAYER ENCAPSULATIONS THAT INCLUDE FUNCTIONAL ELECTRICAL CIRCUITS

(71) Applicant: Cree, Inc., Durham, NC (US)

(72) Inventors: Kenneth P. Brewer, Mesa, AZ (US); Basim Noori, San Jose, CA (US); Marvin Marbell, Morgan Hill, CA (US)

(73) Assignee: Wolfspeed, Inc., Durham, NC (US)

( * ) Notice: Subject to any disclaimer, the term of this patent is extended or adjusted under 35 U.S.C. 154(b) by 298 days.

(21) Appl. No.: 17/085,367

(22) Filed: Oct. 30, 2020

(65) Prior Publication Data
US 2022/0140794 A1    May 5, 2022

(51) Int. Cl.
*H03F 3/195* (2006.01)
*H03F 1/56* (2006.01)
*H03F 3/21* (2006.01)

(52) U.S. Cl.
CPC ............. *H03F 3/195* (2013.01); *H03F 1/565* (2013.01); *H03F 3/211* (2013.01); *H03F 2200/222* (2013.01); *H03F 2200/387* (2013.01); *H03F 2200/451* (2013.01)

(58) Field of Classification Search
CPC .......... H03F 3/195; H03F 1/565; H03F 3/211; H03F 2200/222; H03F 2200/387; H03F 2200/451
USPC ....................................................... 300/295
See application file for complete search history.

(56) References Cited

U.S. PATENT DOCUMENTS

2002/0017952 A1 *   2/2002   Nakai ..................... H01P 1/32
                                                 330/129

OTHER PUBLICATIONS

Shilimkar et. al., "RF LDMOS Transistor Plastic Immunity Enhancement in Power Amplifier Module for 5G Applications", IEEE 2021 (Year: 2021).*
TgardTM 200 Series, Thermally Conductive Insulators, Copyright 2010 Laird Technologies, Inc (Year: 2010).*

* cited by examiner

*Primary Examiner* — Hafizur Rahman
(74) *Attorney, Agent, or Firm* — Myers Bigel, P.A.

(57) ABSTRACT

RF transistor amplifiers are provided that include a submount and an RF transistor amplifier die that is mounted on top of the submount. A multi-layer encapsulation is formed that at least partially covers the RF transistor amplifier die. The multi-layer encapsulation includes a first dielectric layer and a first conductive layer, where the first dielectric layer is between a top surface of the RF transistor amplifier die and the first conductive layer.

20 Claims, 12 Drawing Sheets

RADIO FREQUENCY TRANSISTOR AMPLIFIERS HAVING MULTI-LAYER ENCAPSULATIONS THAT INCLUDE FUNCTIONAL ELECTRICAL CIRCUITS

FIELD

The present invention relates to microelectronic devices and, more particularly, to radio frequency ("RF") transistor amplifiers.

BACKGROUND

Electrical circuits requiring high power handling capability while operating at high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz), among others, have become more prevalent. In particular, there is now high demand for RF transistor amplifiers that are used to amplify RF signals at frequencies of, for example, 500 MHz and higher (including microwave frequencies). These RF transistor amplifiers often need to exhibit high reliability, good linearity and handle high output power levels.

RF transistor amplifiers may be implemented in silicon or wide bandgap semiconductor materials, such as silicon carbide ("SiC") and Group III nitride materials. Herein, the term "wide bandgap" refers to semiconductor materials having a bandgap of greater than 1.40 eV. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF transistor amplifiers are typically implemented using laterally diffused metal oxide semiconductor ("LDMOS") transistors. Silicon LDMOS RF transistor amplifiers can exhibit high levels of linearity and may be relatively inexpensive to fabricate. Group III nitride-based RF transistor amplifiers are typically implemented as High Electron Mobility Transistors ("HEMT") and are primarily used in applications requiring high power and/or high frequency operation where LDMOS RF transistor amplifiers may have inherent performance limitations.

RF transistor amplifiers may include one or more amplification stages, with each stage typically implemented as one or more transistor amplifiers. In order to increase the output power and current handling capabilities, RF transistor amplifiers are typically implemented in a "unit cell" configuration in which a large number of individual "unit cell" transistors are arranged electrically in parallel. An RF transistor amplifier may be implemented as a single integrated circuit chip or "die," or may include a plurality of dies. When multiple RF transistor amplifier die are used, they may be connected in series and/or in parallel.

RF transistor amplifiers often include matching circuits, such as (1) impedance matching circuits that are designed to improve the impedance match (for RF signals at the fundamental operating frequency of the amplifier) between the RF transistor amplifier die and transmission lines connected thereto and (2) harmonic termination circuits that are designed to at least partly terminate harmonics that may be generated during device operation, such as second and third order harmonics. The RF transistor amplifier die(s) as well as the impedance matching and harmonic termination circuits may be enclosed in a package. Electrical leads may extend from the package to electrically connect the RF transistor amplifier to external circuit elements such as input and output RF transmission lines and bias voltage sources.

RF transistor amplifiers are often used in high power and/or high frequency applications. Typically, high levels of heat are generated within an RF transistor amplifier die during operation. If the RF transistor amplifier die becomes too hot, its performance (e.g., output power, efficiency, linearity, gain, etc.) may deteriorate and/or the RF transistor amplifier die may be damaged. As such, RF transistor amplifiers are typically mounted in packages that may be optimized for heat removal.

FIGS. 1A through 1C are various views that schematically illustrate several conventional packaged RF transistor amplifiers. In particular, FIGS. 1A and 1B are schematic cross-sectional views illustrating two example ways of packaging an RF transistor amplifier die, and FIG. 1C is a schematic perspective view of a third way of packaging an RF transistor amplifier die.

As shown in FIG. 1A, a packaged RF transistor amplifier 1 includes an RF transistor amplifier die 10 that is mounted in an open cavity package 50. The package 50 includes metal gate leads 51, metal drain leads 52, a metal submount 53, ceramic sidewalls 54 and a ceramic lid 55.

The RF transistor amplifier die 10 is mounted on the upper surface of the metal submount 53 (which may be a metal flange) in a cavity defined by the metal submount 53, the ceramic sidewalls 54 and the ceramic lid 55. The source terminal of the RF transistor amplifier die 10 may be mounted on the metal submount 53 using, for example, a conductive die attach material. The metal submount 53 may provide the electrical connection to the source terminal and may also serve as a heat dissipation structure that dissipates heat that is generated in the RF transistor amplifier die 10.

Input matching circuits 4 and/or output matching circuits 6 may also be mounted within the package 50, as schematically shown in FIG. 1A. The matching circuits 4, 6 may include impedance matching and/or harmonic termination circuits. The impedance matching circuits may be used to match the impedance of the fundamental component of RF signals that are input to or output from the RF transistor amplifier 1 to the impedance at the input or output of the RF transistor amplifier die 10, respectively. The harmonic termination circuits may be used to ground harmonics of the fundamental RF signal that may be present at the input or output of the RF transistor amplifier die 10. More than one input matching circuit 4 and/or output matching circuit 6 may be provided. As schematically shown in FIG. 1A, the components forming the input and output matching circuits 4, 6 may be mounted on the metal submount 53. The gate lead 51 may be connected to the input matching circuit 4 by one or more bond wires 56, and the input matching circuit 4 may be connected to the gate terminal of the RF transistor amplifier die 10 by one or more bond wires 56. Similarly, the drain lead 52 may be connected to the output matching circuit 6 by one or more bond wires 56, and the output matching circuit 6 may be connected to the drain terminal of RF transistor amplifier die 10 by one or more bond wires 56. The bond wires 56 which are inductive elements, may form part of the input and/or output matching circuits. The gate lead 51 and the drain lead 52 may extend through the ceramic sidewalls 54. The interior of the package 50 may comprise an air-filled cavity.

FIG. 1B is a schematic side view of another conventional packaged RF transistor amplifier 2. RF transistor amplifier 2 differs from RF transistor amplifier 1 in that it includes a different package 50'. The package 50' includes a metal submount 53 (which acts as a metal heat sink and can be implemented as a metal slug), as well as gate and drain leads 51, 52. RF transistor amplifier 2 also includes a plastic overmold 57 that at least partially surrounds the RF transistor amplifier die 10, the leads 51, 52 and the metal submount 53. Other components of RF transistor amplifier 2 may be the same as the like-numbered components of RF transistor amplifier 1 and hence further description thereof will be omitted.

FIG. 1C is schematic perspective view of another conventional packaged RF transistor amplifier 3. As shown in FIG. 1C, the packaged RF transistor amplifier 3 includes an RF transistor amplifier die 10 that is mounted on a submount 53 and enclosed within a dielectric encapsulation 70. The dielectric encapsulation is shown in shadow view to illustrate the underlying components of the RF transistor amplifier 3. The packaged RF transistor amplifier 3 may be mounted on an RF board 60 such as, for example, a printed circuit board. The RF board 60 may include a mounting location for the packaged RF transistor amplifier 3. For example, a large metal pad 66 may be formed on the upper surface of RF board 60 and the packaged RF transistor amplifier 3 may be mounted on this pad via, for example, a die attach material. The metal pad 66 may be electrically connected to a source terminal of the RF transistor amplifier die 10. A plurality of smaller metal pads 68 may be provided about the periphery of metal pad 66. These metal pads 68 may be electrically connected to other circuits or current/voltage sources. Bond wires (not shown) may be used to electrically connect pads (not shown) in the RF transistor amplifier die 10 to various of the metal pads 68 to, for example, provide bias voltages to the RF transistor amplifier die 10. An RF input 62 and an RF output 64 are also provided on the RF board 60. Bond wires 69 or other suitable electrical connections may be used to couple the RF input 62 to a gate terminal 12 of the RF transistor amplifier die 10 and to couple the RF output 64 to a drain terminal 14 of the RF transistor amplifier die 10.

Once the bond wire connections are made between the RF board 60 and the RF transistor amplifier die 10, the dielectric encapsulation 70 may be formed to cover the RF transistor amplifier die 10 and at least part of the submount 53. In some embodiments, the dielectric encapsulation 70 may comprise an overmold encapsulation material that is deposited or formed directly on the RF transistor amplifier die 10 and the submount 53. The overmold encapsulation may comprise, for example, a plastic encapsulation that protects the RF transistor amplifier die 10 from the environment.

SUMMARY

Pursuant to embodiments of the present invention, RF transistor amplifiers are provided that comprise a submount, an RF transistor amplifier die mounted on top of the submount, and a multi-layer encapsulation that at least partially covers the RF transistor amplifier die. The multi-layer encapsulation includes a first dielectric layer and a first conductive layer, and the first dielectric layer is between a top surface of the RF transistor amplifier die and the first conductive layer.

In some embodiments, the multi-layer encapsulation may further include a second dielectric layer, and at least part of the first conductive layer may be sandwiched between the first dielectric layer and the second dielectric layer.

In some embodiments, first conductive layer may be positioned to reduce coupling between an RF input connection to the RF transistor amplifier die and an RF output connection to the RF transistor amplifier die.

In some embodiments, the RF transistor amplifier may further include at least one input bond wire coupled to an RF input of the RF transistor amplifier die and at least one output bond wire coupled to an RF output of the RF transistor amplifier die. The first conductive layer may be configured to reduce coupling between the at least one input bond wire and the at least one output bond wire.

In some embodiments, the first conductive layer may be configured to reduce an inductance of a bond wire connection to the RF transistor amplifier die.

In some embodiments, the first conductive layer may comprise an antenna element that is electrically coupled to an output of the RF transistor amplifier die.

In some embodiments, the RF transistor amplifier may be mounted on an RF board, and the first conductive layer may be electrically connected to the RF board.

In some embodiments, the first conductive layer may comprise a matching circuit.

In some embodiments, the first conductive layer may comprises=a capacitor and an inductor.

In some embodiments, the multi-layer encapsulation may include a variable capacitor implemented therein.

Pursuant to further embodiments of the present invention, RF transistor amplifiers are provided that an RF transistor amplifier die and an encapsulation that at least partially encapsulates the RF transistor amplifier die. The encapsulation includes a first dielectric layer that at least partially encapsulates the RF transistor amplifier die and an electrical circuit that is formed on the first dielectric layer opposite the RF transistor amplifier die.

In some embodiments, the electrical circuit comprise an impedance matching circuit, an interdigitated finger capacitor, and/or a plate capacitor that is formed in two metal layers and a dielectric layer of the encapsulation.

In some embodiments, the electrical circuit may comprise a grounded conductive layer that is positioned to reduce coupling between an RF input connection to the RF transistor amplifier die and an RF output connection to the RF transistor amplifier die.

In some embodiments, the encapsulation may further include a first conductive layer, and at least part of the electrical circuit may be implemented in the first conductive layer. In some embodiments, the first conductive layer may be configured to reduce coupling between the RF input connection and the RF output connection. In some embodiments, the first conductive layer may be configured to reduce an inductance level of a bond wire connection to the RF transistor amplifier die.

In some embodiments, the electrical circuit in the encapsulation may be electrically connected to an external circuit through at least one bond wire.

In some embodiments, the RF transistor amplifier die may be mounted on an RF board, and the electrical circuit in the encapsulation may be electrically connected to an external circuit through a metal pad on the RF board.

In some embodiments, the electrical circuit may comprise an antenna element that is electrically coupled to an output of the RF transistor amplifier die.

Pursuant to still further embodiments of the present invention, RF transistor amplifiers are provided that an RF transistor amplifier die and a multi-layer encapsulation that at least partially encapsulates the RF transistor amplifier die.

The encapsulation includes an antenna element that is coupled to an output of the RF transistor amplifier die.

In some embodiments, the antenna element may be a patch antenna element.

In some embodiments, the encapsulation may include a first conductive layer that forms a ground layer of the patch antenna element and a second conductive layer that includes a patch radiator of the patch antenna element. In some embodiments, the ground layer may extend along a top surface and a side surface of a first dielectric layer of the encapsulation that is between the RF amplifier transistor die and the first conductive layer. In some embodiments, the encapsulation may include a first dielectric layer that is between the RF amplifier transistor die and the first conductive layer and a second dielectric layer that comprises a different material than the first dielectric layer.

Pursuant to additional embodiments of the present invention, RF transistor amplifiers are provided that an RF transistor amplifier die and a multi-layer encapsulation that at least partially encapsulates the RF transistor amplifier die. The encapsulation includes a reactive element that is coupled between an electrical ground reference and either an input or an output of the RF transistor amplifier die.

In some embodiments, the reactive element may be an interdigitated finger capacitor, a plate capacitor, a meandered trace inductor and/or an inductor-capacitor matching circuit.

In some embodiments, the encapsulation may include a first dielectric layer that at least partially encapsulates the RF transistor amplifier die and a first conductive layer that is on the first dielectric layer opposite the RF transistor amplifier die, and the reactive element may be implemented in the first conductive layer. In some embodiments, the connection to the electrical ground reference may be formed in the first conductive layer.

Pursuant to yet additional embodiments of the present invention, RF transistor amplifiers are provided that an RF transistor amplifier die, a plurality of bond wires electrically connecting the RF transistor amplifier die to an external circuit, and a multi-layer encapsulation that at least partially encapsulates the RF transistor amplifier die. The encapsulation includes a grounded conductive layer positioned immediately adjacent at least one of the bond wires.

In some embodiments, the grounded conductive layer may be configured to reduce coupling between an input and an output of the RF transistor amplifier.

In some embodiments, the grounded conductive layer may be configured to reduce an inductance of a bond wire connection to the RF transistor amplifier die.

In some embodiments, the encapsulation may include a first dielectric layer that at least partially encapsulates the RF transistor amplifier die and the grounded conductive layer is on the first dielectric layer opposite the RF transistor amplifier die. In some embodiments, the grounded conductive layer may extend along a top surface and at least one sidewall of the first dielectric layer. In some embodiments, the grounded conductive layer may extend along a sidewall of the first dielectric layer to physically contact a metal pad on an underlying printed circuit board.

In some embodiments, the grounded conductive layer may include a first metal pattern that extends above an input terminal of the RF transistor amplifier die and a second metal pattern that extends above an output terminal of the RF transistor amplifier die.

Pursuant to additional embodiments of the present invention, methods of fabricating RF transistor amplifiers are provided. Pursuant to these methods, an RF transistor amplifier die is mounted on a printed circuit board. A bond wire is connected between the printed circuit board and a terminal of the RF transistor amplifier die. A first dielectric layer of a multi-layer encapsulation is formed on the RF transistor amplifier die, where the first dielectric layer fully encapsulates the bond wire. A first conductive layer of the multi-layer encapsulation is formed on the first dielectric layer, where the first conductive layer is part of an electrical circuit.

In some embodiments, the method further includes forming a second dielectric layer of the multi-layer encapsulation on the first conductive layer.

In some embodiments, the electrical circuit may be an impedance matching circuit, a harmonic termination circuit, an antenna, an interdigitated finger capacitor that is encapsulated between the first and second dielectric layers and/or an electrically grounded isolation circuit.

In some embodiments, the first conductive layer may extend along both a side surface and a top surface of the first dielectric layer.

In some embodiments, the method further includes forming a second conductive layer of the multi-layer encapsulation on the second dielectric layer.

In some embodiments, the first dielectric layer and the second dielectric layer may comprise different materials.

DETAILED DESCRIPTION

Figure 1A:
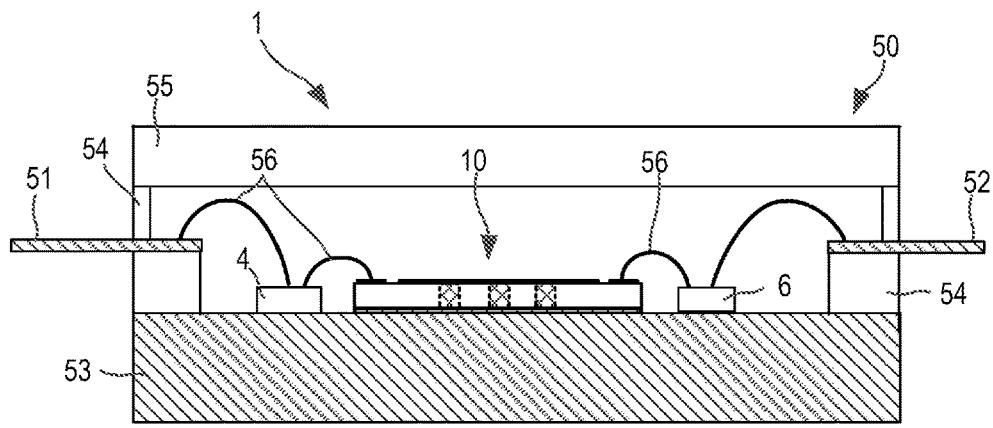
FIG. 1A is a schematic cross-sectional view of a conventional packaged RF transistor amplifier that includes an RF transistor die packaged in a ceramic package.
Figure 1B:
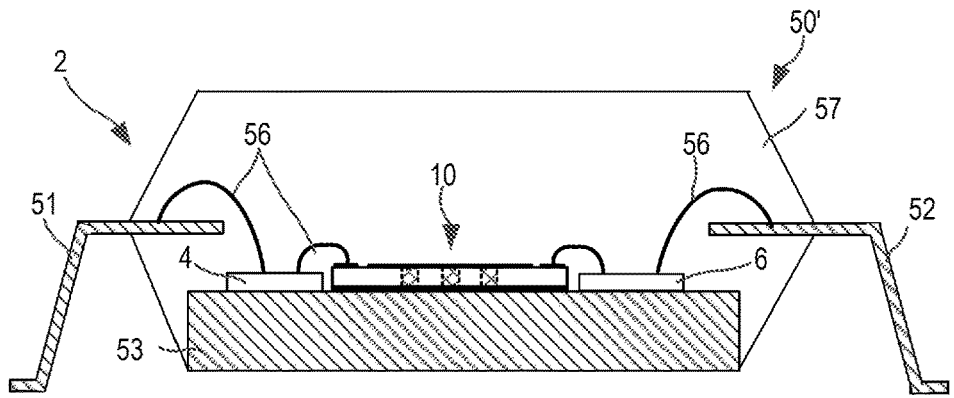
FIG. 1B is a schematic cross-sectional view of another conventional packaged RF transistor amplifier that includes an RF transistor die packaged in a plastic overmold package.

Pursuant to embodiments of the present invention, packaged RF transistor amplifiers are provided that have multi-layer encapsulations that have functional electric circuits formed therein. The multi-layer encapsulations according to embodiments of the present invention may include at least one dielectric layer and at least one conductive layer (e.g., a metal layer). The conductive layer(s) may form one or more functional electric circuits. The conductive layers may be electrically grounded, electrically floating, or connected to the input and/or output of the RF transistor die. The dielectric layer(s) may provide environmental protection to the RF transistor die and optionally contribute to the functional electric circuits. In some embodiments, one or more of the dielectric layers may be comprised of a plastic overmold that is used to encapsulate the RF transistor amplifier die.

In some embodiments, the conductive layer may be used to form an RF shield (also known as an electromagnetic interference shield). For example, a plastic overmold may be used to encapsulate an RF transistor amplifier die and the bond wires (or other electrical connections) that connect the RF transistor amplifier to external circuits such as circuits on an RF board. Sheets of conductive material may then be formed on (1) the portion of the plastic overmold that covers the input bond wires and/or (2) on the portion of the plastic overmold that covers the output bond wires. These sheets of conductive material may act as a shield that reduces RF emissions from the packaged RF transistor amplifier (e.g., from the bond wires, from the input and output pads, etc.). The sheets of conductive material may be electrically floating, or may be electrically connected to a ground reference (e.g., to a ground reference on an underlying RF board). In cases where the conductive sheets are electrically grounded, the conductive sheets may be placed in close proximity to the input bond wires and/or to the output bond wires. Positioning such a ground reference by the bond wires may reduce the inductance of the bond wires. This may be beneficial in applications where the inductance of the input or output bond wires is greater than a desired inductance for matching purposes. Additionally, the ground reference in the encapsulation may be configured to change the directions of the electric and/or magnetic fields in a way that increases the isolation between the input and output of the RF transistor amplifier.

In other example embodiments, elements of input or output matching circuits may be formed in the conductive layer(s) of the multi-layer encapsulation. For example, a series inductor-capacitor ("LC") circuit may be formed in the encapsulation by implementing an inductance as a meandered trace and by implementing a capacitor as an interdigitated finger capacitor, a parallel plate capacitor, or as a "lumped" capacitor. This may provide a convenient technique for implementing an LC circuit between the input or output and ground. Many other electrical circuits may be implemented in the multi-layer encapsulation, including various impedance matching and harmonic termination circuits. In still other embodiments, one or more antenna elements may be implemented within the multi-layer encapsulation such as, for example patch antenna elements. This technique may allow an RF transistor amplifier and an associated antenna element to be implemented in a single, small module.

Pursuant to some embodiments, RF transistor amplifiers are provided that include a submount and an RF transistor amplifier die that is mounted on top of the submount. The submount may comprise, for example, a metal base, a ceramic base, a ceramic base that includes conductive vias, a printed circuit board or the like. A multi-layer encapsulation is formed that at least partially covers the RF transistor amplifier die. The multi-layer encapsulation includes a first dielectric layer and a first conductive layer, where the first dielectric layer is between a top surface of the RF transistor amplifier die and the first conductive layer. The multi-layer encapsulation may optionally include a second dielectric layer. If the second dielectric layer is provided, at least part of the first conductive layer may be sandwiched between the first dielectric layer and the second dielectric layer.

In some embodiments, the first conductive layer may be positioned to reduce coupling between an RF input connection to the RF transistor amplifier die and an RF output connection to the RF transistor amplifier die. The first conductive layer may additionally or alternatively be configured to reduce an inductance of a bond wire connection to the RF transistor amplifier die. The first conductive layer may alternatively or additionally include a matching circuit.

In other embodiments, the first conductive layer may comprise an antenna element that is electrically coupled to an output of the RF transistor amplifier die. In the above embodiments, the RF transistor amplifier may be mounted on an RF board, and the first conductive layer may be electrically connected to the RF board.

Pursuant to further embodiments of the present invention, RF transistor amplifiers are provided that include an RF transistor amplifier die and a multi-layer encapsulation. The encapsulation includes a first dielectric layer that at least partially encapsulates the RF transistor amplifier die and an electrical circuit that is formed on the first dielectric layer opposite the RF transistor amplifier die. The electrical circuit may comprise, for example, one or more of an impedance matching circuit, an interdigitated finger capacitor, a plate capacitor, a variable capacitor, a grounded conductive layer that is positioned to reduce coupling between an RF input connection to the RF transistor amplifier die and an RF output connection of the RF transistor amplifier die, an antenna element that is coupled to the RF output connection of the RF transistor amplifier die, and a circuit that is configured to reduce an inductance of a bond wire connection to the RF transistor amplifier die. The electrical circuit in the encapsulation may be electrically connected to an external circuit through at least one bond wire or may extend along a wall of the first dielectric layer to electrically connect to an underlying printed circuit board.

Pursuant to still further embodiments of the present invention, antenna systems are provided that includes an RF transistor amplifier die and a multi-layer encapsulation that at least partially encapsulates the RF transistor amplifier die, where the encapsulation includes an antenna element that is coupled (either AC or DC) to an output of the RF transistor amplifier die. The antenna element may comprise, for example, a patch antenna element. The encapsulation may include a first conductive layer that forms a ground layer of the patch antenna element and a second conductive layer that includes a patch radiator of the patch antenna element. The ground layer may extend along a top surface and a side surface of a first dielectric layer of the encapsulation that is between the RF amplifier transistor die and the first conductive layer. The encapsulation may further include a second dielectric layer that is between the RF amplifier transistor die and the first conductive layer. The second dielectric layer may comprise a different material than the first dielectric layer.

Pursuant to still further embodiments, RF transistor amplifiers are provided that include an RF transistor amplifier die and a multi-layer encapsulation that at least partially encapsulates the RF transistor amplifier die, where the encapsulation includes a reactive element such as an inductor and/or a capacitor that is coupled between an electrical ground reference and either an input or an output of the RF transistor amplifier die.

Embodiments of the present invention will now be discussed in further detail with reference to FIGS. 2A-13B.

Figure 2A:
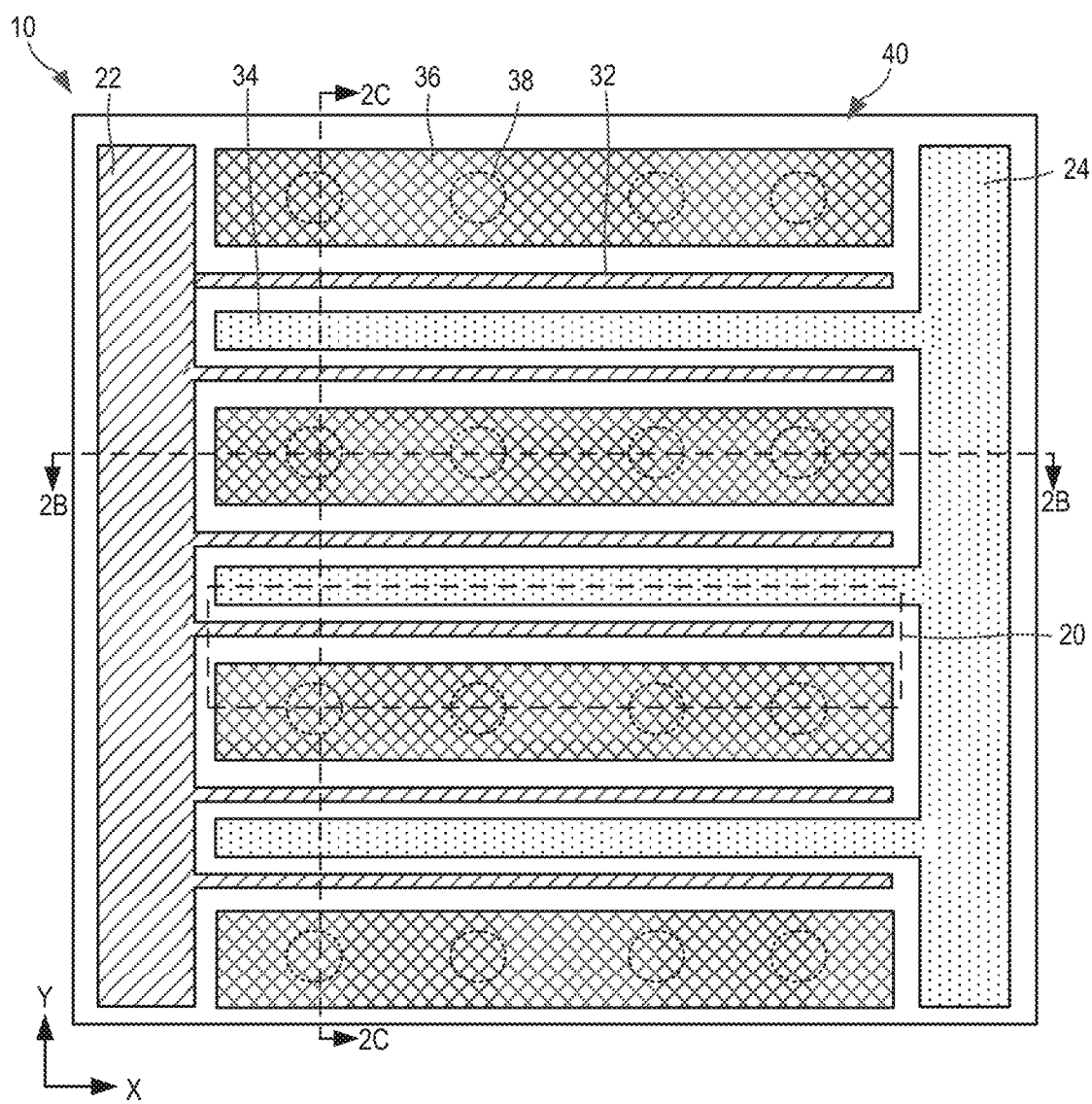
FIG. 2A is a schematic plan view of a Group III nitride-based RF transistor amplifier die before most of the top-side metallization structure is formed that illustrates the lower portion of the metallization structure that is formed directly on the top surface of the semiconductor layer structure of the RF transistor amplifier die.
Figure 2B:
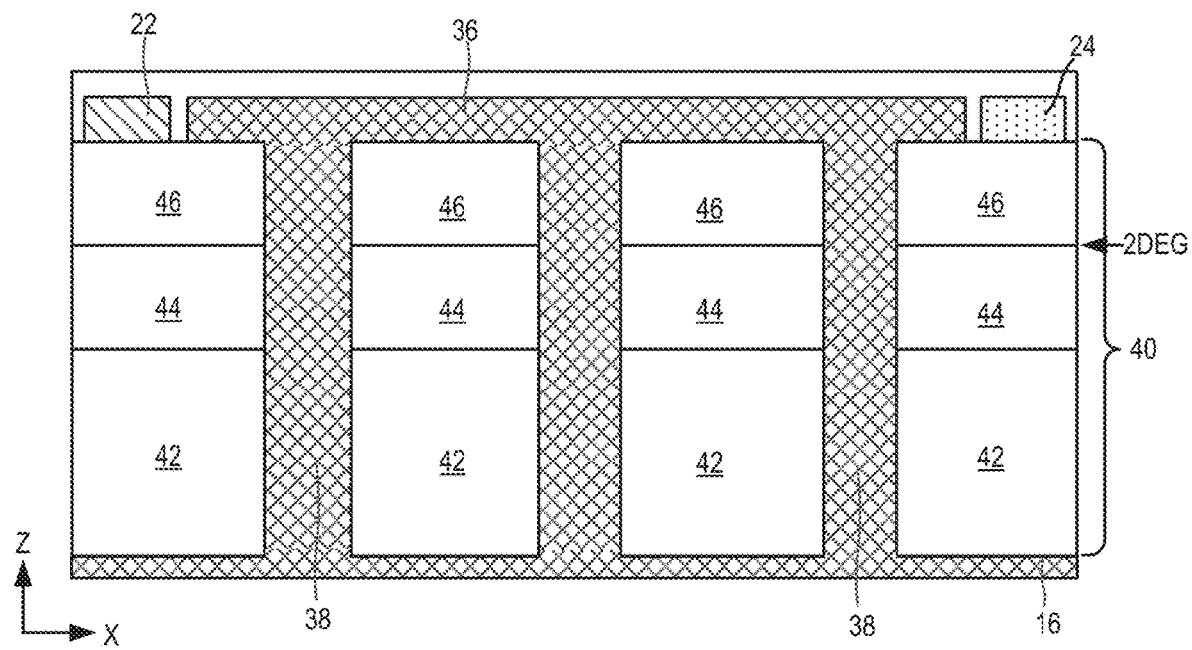
FIGS. 2B and 2C are schematic cross-sectional views of the RF transistor amplifier die of FIG. 2A that are taken along lines 2B-2B and 2C-2C of FIG. 2A, respectively.
Figure 2C:
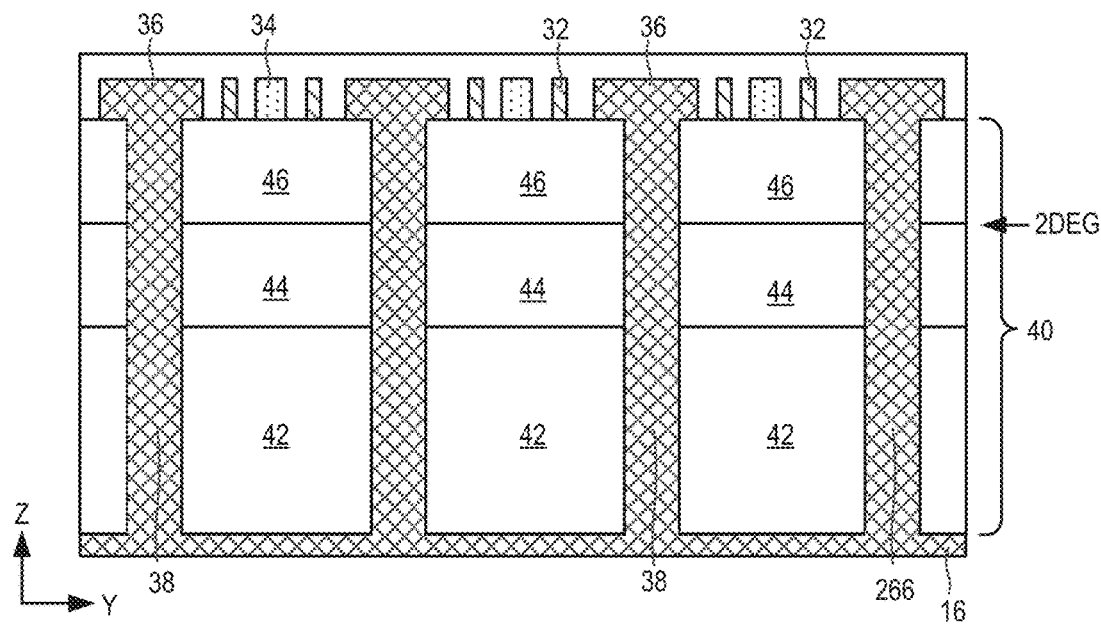

Before describing various RF transistor amplifiers according to embodiments of the present invention, a Group III nitride-based RF transistor amplifier die 10 will be described with reference to FIGS. 2A-2C that can be used in the RF transistor amplifiers according to embodiments of the present invention. In particular, FIG. 2A is a schematic plan view of the Group III nitride-based RF transistor amplifier die 10 with most of the top-side metallization structure removed so that only the top-side metallization that directly contacts the underlying semiconductor layer structure is shown. FIGS. 2B and 2C are schematic cross-sectional views of the RF transistor amplifier die of FIG. 2A that are taken along lines 2B-2B and 2C-2C of FIG. 2A, respectively. While FIGS. 2A-2C illustrate one example Group III nitride-based RF transistor amplifier die that may be used in the RF transistor amplifiers according to embodiments of the present invention, it will be appreciated that other Group III nitride-based RF transistor amplifier die or non-Group III nitride-based RF transistor amplifier die (e.g., silicon LDMOS transistor amplifier die) may alternatively be used.

Figure 3A:
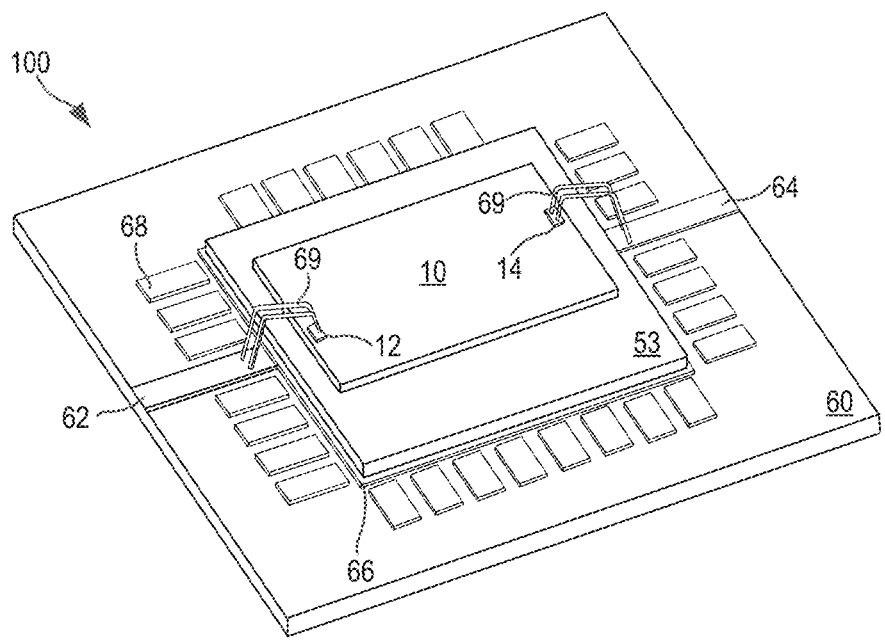
FIG. 3A is a schematic perspective view of an RF transistor amplifier mounted on an RF board.

FIG. 2A schematically depicts a cut through the top side metallization structure of RF transistor amplifier die 10. The RF transistor amplifier die 10 includes a gate terminal 12 and a drain terminal 14 that are exposed on the top side of the RF transistor amplifier die 10. The gate terminal 12 and the drain terminal 14 are not visible in FIG. 2A as they may form the upper part of the top-side metallization structure, but example implementations of the gate terminal 12 and the drain terminal 14 are shown, for example, in FIG. 3A. As is also shown in FIG. 3A, first and second circuit elements may be connected, respectively, to the gate terminal 12 and drain terminal 14 by, for example, bond wires. The first circuit element may, for example, pass or filter an input RF signal that is to be amplified to the RF transistor amplifier die 10, and the second circuit element may receive an amplified RF signal that is output by the RF transistor amplifier die 10.

As shown in FIG. 2A, the top side metallization structure includes a gate bus 22, a drain bus 24, a plurality of gate fingers 32, a plurality of drain fingers 34 and a plurality of source fingers 36, all of which may be formed on an upper surface of a semiconductor layer structure 40 (the semiconductor layer structure will be discussed below with reference to FIGS. 2B and 2C). The gate bus 22 and gate fingers 32 are part of a gate electrode of the RF transistor amplifier die 10. The gate bus 22 and the gate fingers 32 may be implemented as a first monolithic metal pattern. The drain bus 24 and drain fingers 34 are part of a drain electrode of the RF transistor amplifier die 10, and may be implemented as a second monolithic metal pattern. The gate fingers 32 may be formed of materials that are capable of making a Schottky contact to a Group III nitride-based semiconductor material, such as Ni, Pt, Cu, Pd, Cr, W and/or WSiN. The drain fingers 32 and source fingers 36 may include a metal, such as TiAlN, that can form an ohmic contact to Group III nitride-based materials. A dielectric layer (or a series of dielectric layers) that help isolate the gate metallization 22, 32, the drain metallization 24, 34 and the source metallization 36 from each other is not shown in FIG. 2A to better illustrate the elements of the top side metallization structure.

The gate terminal 12 (FIG. 3A) may be electrically connected to the gate bus 22 and the drain terminal 14 (FIG. 3A) may be electrically connected to the drain bus 24, either directly or through intervening structures such as conductive vias. A source terminal 16 (FIGS. 2B-2C) may be formed on the back side of the semiconductor layer structure 40. The source fingers 36 may be physically and electrically connected to the source terminal 16 through source vias 38. The source vias 38 may comprise, for example, metal-plated (or metal-filled) vias that extend through the semiconductor layer structure 40. The gate, drain and source terminals 12, 14, 16 may comprise, for example, conductive bond pads.

The RF transistor amplifier die 10 may comprise a Group III nitride-based HEMT RF transistor amplifier die that includes a plurality of unit cell transistors 20 that are electrically connected to each other in parallel. One of these unit cell transistors 20 is identified by the dashed box in FIG. 2A. As shown, the unit cell transistor 20 includes a gate finger 32, a drain finger 34 and a source finger 36 along with the underlying portion of the semiconductor layer structure 40. Since all of the gate fingers 32 are electrically connected to a common gate bus 22, all of the drain fingers 34 are electrically connected to a common drain bus 24, and all of the source fingers 36 are electrically connected together through the source terminal 16, it can be seen that the unit cell transistors 20 are all electrically connected together in parallel.

Referring to FIGS. 2B and 2C, the semiconductor layer structure 40 includes a plurality of semiconductor layers. In the depicted embodiment, a total of two semiconductor layers are shown, namely a channel layer 44 and a barrier layer 46 that is on a top side of the channel layer 44. The semiconductor layer structure 40 may (and typically will) include additional semiconductor and/or non-semiconductor layers. For example, the semiconductor layer structure 40 may include a growth substrate 42 on which the other semiconductor layers are grown. The growth substrate 42 may comprise, for example, a 4H-SiC or 6H-SiC substrate. In other embodiments, the growth substrate may be a different semiconductor material (e.g., silicon or a Group III nitride-based material, GaAs, ZnO, InP) or a non-semiconductor material (e.g., sapphire).

Optional buffer, nucleation, strain balancing, transition and/or other layers (not shown) may be provided on the growth substrate 42 beneath the channel layer 44. For example, an AlN buffer layer may be included to provide an appropriate crystal structure transition between a SiC growth substrate 42 and the remainder of the semiconductor layer structure 40.

In some embodiments, the channel layer 44 is a Group III nitride material, such as $Al_xGa_{1-x}N$ where $0 \leq x < 1$, provided that the energy of the conduction band edge of the channel layer 44 is less than the energy of the conduction band edge of the barrier layer 46 at the interface between the channel and barrier layers 44, 46. In certain embodiments of the present invention, x=0, indicating that the channel layer 44 is gallium nitride ("GaN"). The channel layer 44 may also be other Group III nitrides such as InGaN, AlInGaN or the like. The channel layer 44 may be undoped or unintentionally doped and may be grown to a thickness of, for example, greater than about 20 Å. The channel layer 44 may also be a multi-layer structure, such as a superlattice or combinations of GaN, AlGaN or the like.

The channel layer 44 may have a bandgap that is less than the bandgap of at least a portion of the barrier layer 46, and the channel layer 44 may also have a larger electron affinity than the barrier layer 46. In certain embodiments, the barrier layer 46 is AlN, AlInN, AlGaN or AlInGaN. In particular embodiments, the barrier layer 46 is thick enough and has a high enough Al composition and doping to induce a significant carrier concentration at the interface between the channel layer 44 and the barrier layer 46.

The barrier layer 46 may be a Group III nitride and may have a bandgap larger than that of the channel layer 44 and a smaller electron affinity than the channel layer 44. The barrier layer 46 may include AlGaN, AlInGaN and/or Al or combinations of layers thereof. The barrier layer 46 may, for example, be from about 0.1 nm to about 30 nm thick. In certain embodiments, the barrier layer 46 is undoped or doped with an n-type dopant to a concentration less than about $10^{19}$ cm$^{-3}$. In some embodiments of the present invention, the barrier layer 46 is $Al_xGa_{1-x}N$ where $0<x<1$. In particular embodiments, the aluminum concentration is about 25%. However, in other embodiments of the present invention, the barrier layer 46 comprises AlGaN with an aluminum concentration of between about 5% and about 100%.

Due to the difference in bandgap between the barrier layer 46 and the channel layer 44 and piezoelectric effects at the interface between the barrier layer 46 and the channel layer 44, a two dimensional electron gas (2DEG) is induced in the channel layer 44 at a junction between the channel layer 44 and the barrier layer 46. The 2DEG acts as a highly conductive layer that allows conduction between the source region of each unit cell transistor 20 and its associated drain region, where the source region is the portion of the semiconductor layer structure 40 that is directly underneath the source finger 36 and the drain region is the portion of the semiconductor layer structure 40 that is directly underneath the corresponding drain finger 34.

An interlayer insulating layer is formed over the gate fingers 32, the drain fingers 34, and the source fingers 36. The interlayer insulating layer may include a dielectric material, such as SiN, $SiO_2$, etc. Electrical connections between the gate bus 22 and the gate terminal 12 (FIG. 3A) and between the drain bus 24 and the drain terminal 14 (FIG. 3A) may be formed through the interlayer insulating layer.

Figure 3B:
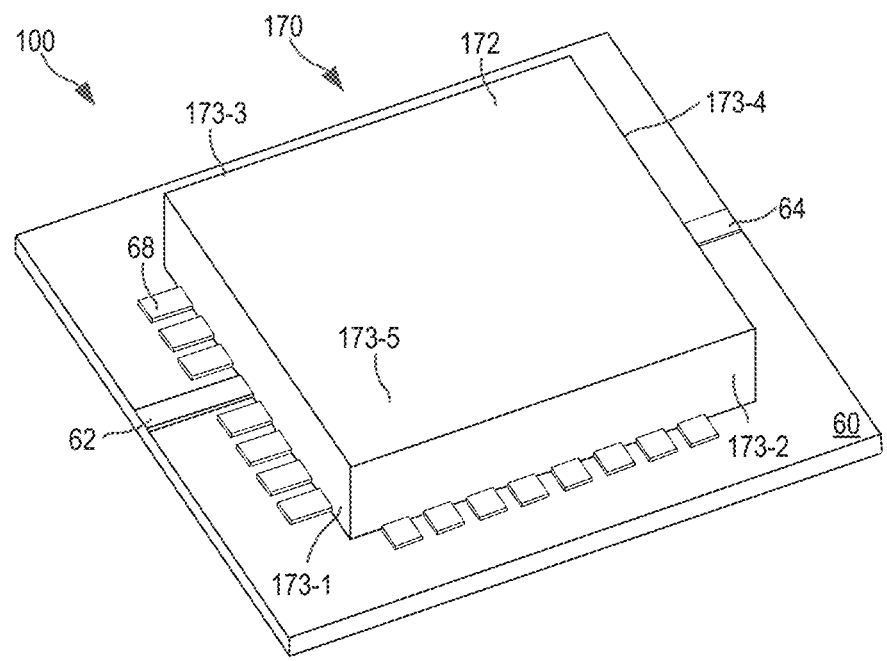
FIG. 3B is a schematic perspective view of the RF transistor amplifier and RF board of FIG. 3A with a first layer of a multi-layer encapsulation according to embodiments of the present invention formed thereon.
Figure 3C:
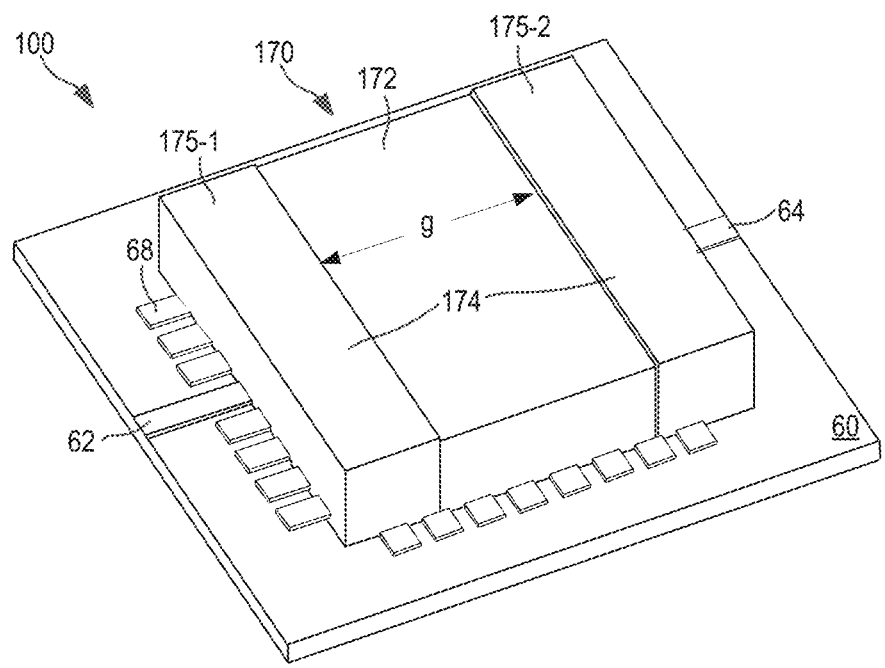
FIG. 3C is a schematic perspective view of the device of FIG. 3B with a second layer of the multi-layer encapsulation added.
Figure 3D:
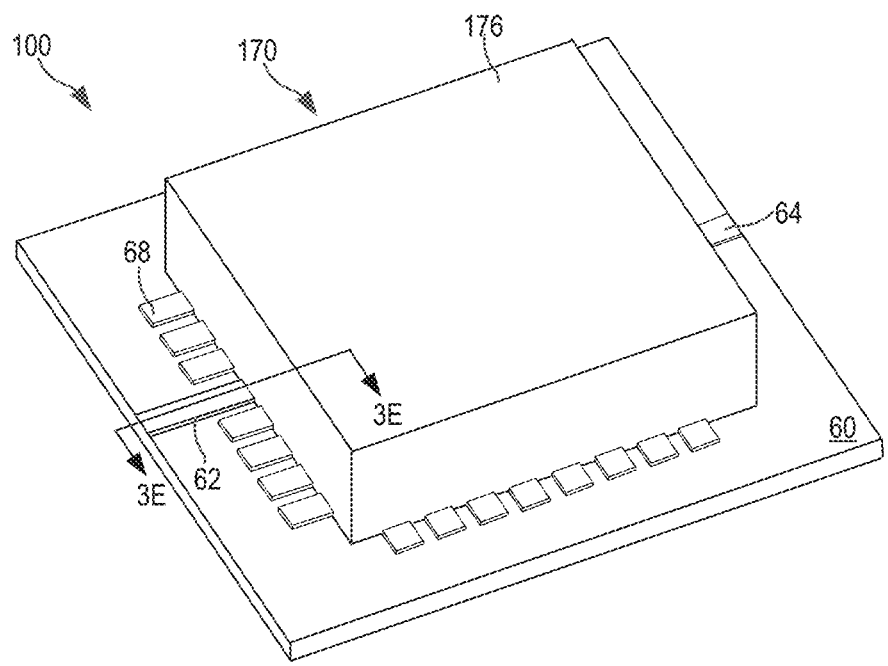
FIG. 3D is a schematic perspective view of the device of FIG. 3C with a third layer of the multi-layer encapsulation added.

FIGS. 3A-3D schematically illustrate a packaged RF transistor amplifier 100 according to embodiments of the present invention. In particular, FIG. 3A is a schematic perspective view of the RF transistor amplifier 100 (before it is packaged in a multi-layer encapsulation 170) mounted on an RF board 60. FIG. 3B is a schematic perspective view of the RF transistor amplifier 100 and RF board 60 of FIG. 3A with a first layer of the multi-layer encapsulation 170 according to embodiments of the present invention formed thereon. FIG. 3C is a schematic perspective view of the RF transistor amplifier 100, RF board 60 and multi-layer encapsulation 170 of FIG. 3B with a second layer of the multi-layer encapsulation 170 added. Finally, FIG. 3D is a schematic perspective view of the RF transistor amplifier 100, RF board 60 and multi-layer encapsulation 170 of FIG. 3C with a third layer of the multi-layer encapsulation 170 added.

Figure 1C:
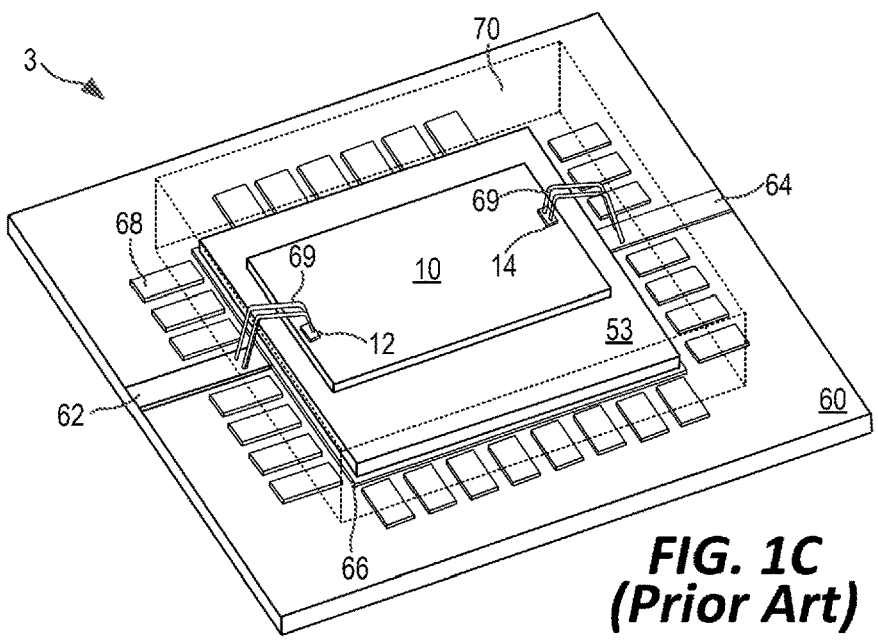
FIG. 1C is a schematic perspective view of another conventional packaged RF transistor amplifier that comprises an RF transistor amplifier die mounted on an RF board and enclosed inside a dielectric encapsulation.

As shown in FIG. 3A, the packaged RF transistor amplifier 100 may include the RF transistor amplifier die 10 that is discussed with reference to FIGS. 2A-2C above, and the RF transistor amplifier die 10 may be mounted on a submount 53 which in turn is mounted on the RF board 60 in the same fashion as discussed above with reference to the conventional packaged RF transistor amplifier 3 of FIG. 1C. The submount 53 may be formed of a thermally conductive material in order to dissipate heat generated in the RF transistor amplifier die 10. The submount 53 may comprise, for example, a metal slug or a ceramic material having conductive vias extending therethrough. If the RF transistor amplifier die 10 has its source terminal 16 on a bottom side thereof, as is the case with the RF transistor amplifier die 10 of FIGS. 2A-2C, then the submount 53 may also provide an electrical connection between the source terminal and a source voltage (typically ground) on the RF board 60. Bond wires 69 or other suitable electrical connections may be used to couple the RF input 62 on the RF board 60 to the gate terminal 12 of the RF transistor amplifier die 10 and to couple the RF output 64 on the RF board 60 to the drain terminal 14 of the RF transistor amplifier die 10. As the RF transistor amplifier die 10, submount 53, RF board 60 and bond wires 69 have been discussed in detail above with reference to FIG. 1C, further description of these components will be omitted here.

As shown in FIG. 3B, a first layer 172 of a multi-layer encapsulation 170 is formed to at least partially cover the RF transistor amplifier die 10, the submount 53 and the input and output bond wires 69. In some embodiments, the first layer 172 of the multi-layer encapsulation 170 may comprise a dielectric overmold encapsulation material that is deposited or formed directly on the RF transistor amplifier die 10 and the submount 53. The overmold encapsulation may comprise, for example, a plastic encapsulation that protects the RF transistor amplifier die 10 from the environment. In the depicted embodiment, the input and output bond wires 69 are completely encapsulated within the first dielectric layer 172 of the multi-layer encapsulation 170. The thickness of the plastic overmold encapsulation may be adjusted based on a height of the bond wires 69 above the top surface of the RF board 60. The first dielectric layer includes a front wall 173-1, oppose sidewalls 173-2, 173,3 and a rear wall 173-4, as well as a top surface 173-5.

As shown in FIG. 3C, a second layer 174 of the multi-layer encapsulation 170 may then be formed on the first dielectric layer 172. In this embodiment, the second layer 174 comprises first and second conductive patterns 175-1, 175-2 that are formed or otherwise deposited on the first layer 172. The first and second conductive patterns 175-1, 175-2 may comprise thin metal layers that are formed of a metal such as copper or a copper alloy. The first and second conductive patterns 175-1, 175-2 may be deposited/formed by a wide variety of techniques such as chemical vapor deposition, sputtering, other coating processes, etc. As shown in FIG. 3C, the first metal pattern 175-1 may extend across the top surface 173-5 of the dielectric layer 172 above the input side of the RF transistor amplifier die 10. The first metal pattern 175-1 may also extend along the front wall 173-1 of the first dielectric layer 172 as well as on the opposed sidewalls 173-2, 173-3 of the first dielectric layer 172. Similarly, the second metal pattern 175-2 may extend across the top surface 173-5 of the dielectric layer 172 above the output side of the RF transistor amplifier die 10. The second metal pattern 175-2 may also extend along the rear wall 173-4 of the first dielectric layer 172 as well as on the opposed sidewalls 173-2, 173-3. The portions of the first and second metal patterns 175-1, 175-2 that extend on the front, rear and sidewalls of the first dielectric layer 172 may be electrically connected to one or more of the metal pads 68 on RF board 60. For example, various of the metal pads 68 may be connected to ground, and hence the first and second metal patterns 175-1, 175-2 may be maintained at a ground potential through their connections to the grounded metal pads 68.

The first and second metal patterns 175-1, 175-2 may act as functional electrical circuits. For example, the first and second metal patterns 175-1, 175-2 may act as RF isolation shields that shield the RF transistor amplifier die 10 and the input and output connections to the RF transistor amplifier die 10 from external RF radiation. The first and second metal patterns 175-1, 175-2 may also help prevent RF energy radiated from the input and output connections to the RF transistor amplifier die 10 from radiating outwardly where it might negatively impact other nearby electronic components. It should be noted that while the first and second metal patterns 175-1, 175-2 may be electrically grounded in order to improve the shielding effect, in some embodiments the first and second metal patterns 175-1, 175-2 may be left electrically floating and may still provide some shielding.

It will also be appreciated that while the embodiment of FIG. 3C includes both the first and second metal patterns 175-1, 175-2, in other embodiments, only the first metal pattern 175-1 or the second metal pattern 175-2 may be provided. It will also be understood that the size of the first and/or second metal patterns 175-1, 175-2 may be varied from what is shown in FIG. 3C. For example, in other embodiments, the widths of the first and second metal patterns 175-1, 175-2 may be varied so that the size of the gap "g" that separates the patterns 175-1, 175-2 are separated by smaller or larger gaps, the patterns 175-1, 175-2 may not extend to the front, rear or sidewalls 173-1 through 173-4, or the two patterns 175-1, 175-2 may merge into a single metal pattern 175 that, for example, covers at least the entire upper surface of the first dielectric layer 172.

Referring to FIG. 3D, a third layer 176 of the multi-layer encapsulation 170 may then be formed on top of the first and second layers 172, 174. The third layer 176 may comprise a dielectric material. For example, the third layer 176 may comprise a dielectric overmold encapsulation material that is deposited or formed directly on the second metal layer 174 and on exposed portions of the first dielectric layer 172. The overmold encapsulation may be the same material used to form the first dielectric layer 172 in some embodiments. The third dielectric layer 176 may fully encapsulate the second metal layer 174 and hence prevent any accidental short circuits to the second metal layer 174.

Figure 3E:
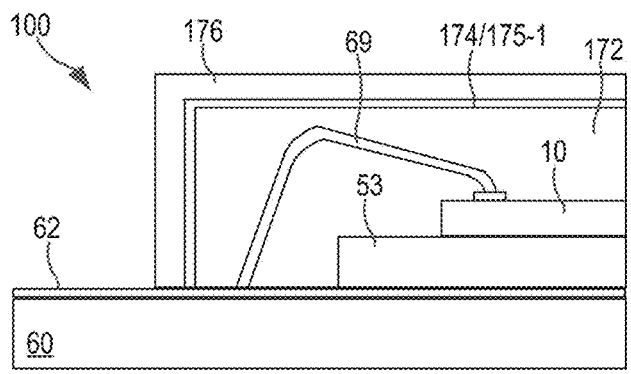
FIG. 3E is a schematic cross-sectional view of the RF transistor amplifier of FIG. 3D taken along line 3E-3E of FIG. 3D.

FIG. 3E is a schematic cross-sectional view of the RF transistor amplifier 100 taken along line 3E-3E of FIG. 3D. As shown in FIG. 3E, the first metal pattern 175-1 may be located in close proximity to the input bond wires 69. Particularly in embodiments where the first metal pattern 175-1 is electrically grounded, this ground layer will alter the electric and magnetic fields that are generated as RF currents pass through the input bond wires 69. In particular, the first metal pattern 175-1 will tend to cause these fields to strengthen in the direction of the first metal pattern 175-1. As a result, the electric and magnetic fields that are generated as RF currents pass through the input bond wires 69 will have reduced strength in the direction of the output bond wires 69. The same effect happens on the output side of the RF transistor amplifier 100, with the electric and magnetic fields that are generated as RF currents pass through the output bond wires 69 being redirected to be stronger in the direction of the second metal pattern 175-2 and weaker in the direction of the input bond wires 69. As such, the first and second metal patterns 175-1, 175-2 may act to reduce coupling between the input and output sides of the RF transistor amplifier 100 (e.g., between the input bond wires 69 and the output bond wires 69).

Coupling between the input and output bond wires 69 may adversely impact the performance of the packaged RF transistor amplifier 100. In particular, interaction between the input and output bond wires 69 may introduce a parasitic capacitance between the gate terminal 12 and the drain terminal 14 of the RF transistor amplifier die 10 (e.g., $C_{gd}$) which may cause an adverse effect on the stability and efficiency of the packaged RF transistor amplifier 100. In addition, these bond wires 69 may also have a magnetic coupling, which may contribute to a feedback network within the packaged RF transistor amplifier 100, deteriorating its performance. Thus, by configuring the first and/or second metal patterns 175-1, 175-2 to change the electric and magnetic field distributions, the performance of the RF transistor amplifier 100 may be improved.

Additionally, positioning the first and second metal layers 175-1, 175-2 in close proximity with the bond wires 69 may have additional benefits. As discussed above, RF transistor amplifiers often include matching circuits such as impedance matching circuit that match the input and/or output of the RF transistor amplifier die to the impedance of the transmission lines that carry RF signals to/from the die and/or harmonic termination circuits that terminate certain harmonics to ground. These matching circuits typically include inductors and/or capacitors. The amount of capacitance and inductance is selected so as match the impedance or to provide a path to ground for the desired harmonics. The input bond wires 69 that electrically connect the input RF transmission line 62 to the RF transistor amplifier die 10 and the output bond wires 69 that electrically connect an output RF transmission line 64 to the RF transistor amplifier die 10 are often used to generate at least some of the inductance required by the matching circuits. The amount of inductance provided may be varied, for example, by varying the number of bond wires and/or by changing the length and/or the cross-sectional area (e.g., the diameter) of the bond wires so that the bond wires provide a desired amount of inductance.

Unfortunately, as applications move to higher frequencies, the inductance of the bond wires 69 may exceed a desired amount of inductance for the impedance matching and/or harmonic termination circuits. When this occurs, bond wires that are very short and/or that have large cross-sectional areas may be used in an effort to decrease the inductance thereof to suitable levels. Very short bond wires, however, may be difficult to solder in place, which may increase manufacturing costs, and/or may result in higher device failure rates. Bond wires having large cross-sectional areas may require larger gate and drain bond pads on the RF transistor amplifier die 10, which may require an increase in the overall size of the RF transistor amplifier die 10, which is also undesirable. Moreover, in some higher frequency applications, even very short bond wires having large cross-sectional areas may have too much inductance such that the matching networks cannot, for example, properly terminate the second or third order harmonics or provide a suitable impedance match over a sufficiently large bandwidth.

As discussed above, in the RF transistor amplifiers according to embodiments of the present invention, metal layers such as the first and second metal patterns 175-1, 175-2 may be integrated into the encapsulation for the device and may be positioned in close proximity to the input and/or output bond wires 69. Positioning a ground reference in close proximity to a plurality of bond wires acts to reduce the mutual inductance of the bond wires, thereby effectively decreasing the inductance in the bond wires. In applications where the bond wires 69 inject too much inductance, this technique may improve the performance of the impedance matching and/or harmonic termination circuits. Improved impedance matching reduces return loss, typically allowing the RF transistor amplifier to operate over a larger operating frequency range. Improved harmonic termination circuits may improve the passive intermodulation distortion performance and/or stability of the device. Thus, by configuring the second metal layer 174 to reduce the mutual inductance of the input and/or output bond wires 69, the performance of the RF transistor amplifier 100 may be improved in some applications.

Figure 4A:
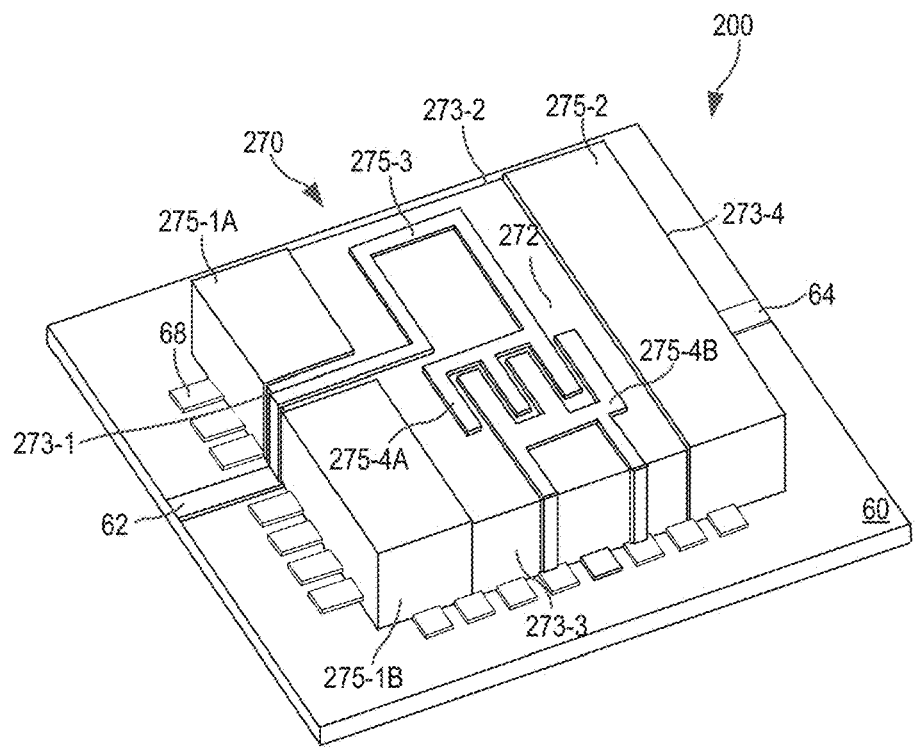
FIG. 4A is a schematic perspective view an RF transistor amplifier mounted on an RF board and protected by a multi-layer encapsulation according to further embodiments of the present invention.

FIG. 4A is a schematic perspective view of an RF transistor amplifier 200 according to further embodiments of the present invention that is mounted on an RF board 60 and protected by a multi-layer encapsulation 270. The multi-layer encapsulation 270 includes at least a first dielectric layer 272 and a second metal layer 274. An optional third dielectric layer (not shown) may be formed to encapsulate the first dielectric layer 272 and the second metal layer 274. This third dielectric layer may be identical to the third dielectric layer 176 of RF transistor amplifier 100 and hence further description thereof will be omitted.

The RF transistor amplifier 200 may be identical to the RF transistor amplifier 100 described above, except that it may have a different design for its multi-layer encapsulation 270. As shown in FIG. 4A, the multi-layer encapsulation 270 includes a first dielectric layer 272, which may be identical to the first dielectric layer 172 discussed above, and a second metal layer 274. The second metal layer includes a first metal pattern 275-1 which is a two-piece metal layer, a second metal pattern 275-2 which may be identical to the second metal pattern 175-2 of multi-layer encapsulation 170 discussed above, a third metal pattern 275-3 and a fourth metal pattern 275-4, which is also a two-piece metal layer.

The two-piece metal pattern 275-1 includes a first pattern 275-1A that extends across a first portion of the top surface 273-5 of the first dielectric layer 272 above the input side of the RF transistor amplifier die 10 and along a front wall 273-1 of the first dielectric layer 272. The first pattern 275-1A also extends on the first sidewall 273-2 of the first dielectric layer 272. Similarly, the second pattern 275-1B extends across a second portion of the top surface 273-5 of the first dielectric layer 272 above the input side of the RF transistor amplifier die 10, along the front wall 273-1 of the first dielectric layer 272 as well as on the second sidewall 273-3 of the first dielectric layer 272. The portions of the first and second patterns 275-1A, 275-1B that extend on the front, rear and sidewalls 273-1 through 273-4 of the first dielectric layer 272 may be electrically connected to one or more of the metal pads 68 on RF board 60. The two-piece metal pattern 275-1 thus may be very similar to the first metal pattern 175-1 of multi-layer encapsulation 170, except that a middle portion of the first metal pattern 175-1 is omitted in multi-layer encapsulation 270 in order to provide a path for metal pattern 275-3 to connect to the RF input 62 on RF board 60.

The third metal pattern 275-3 comprises an elongated trace that electrically connects the RF input 62 on RF board 60 to a first pattern 275-4A of the two-piece fourth metal pattern 275-4. This elongated trace may be designed to have a desired amount of inductance for an input matching circuit such as an input impedance matching circuit or an input harmonic termination circuit. The fourth metal pattern 275-4 may comprise an interdigitated finger capacitor. As shown in FIG. 4A, the first piece 275-4A is connected to the RF input 60 (by the third metal layer 275-3) and the second piece 275-4B is connected to ground via two of the metal pads 68 on RF board 60. The first and second pieces 275-4A, 275-4B are arranged in a close proximity to each other and have matching comb structures so that the two pieces capacitively couple, as will be understood by those of skill in the art.

Figure 4B:
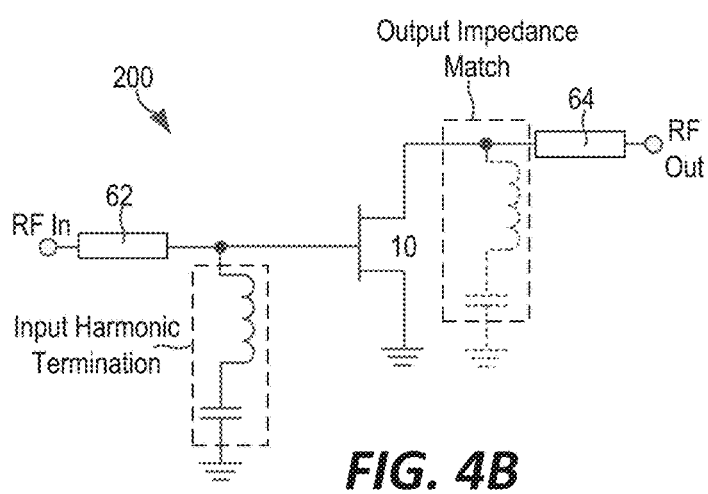
FIG. 4B is a circuit diagram of the RF transistor amplifier of FIG. 4A.

FIG. 4B is a circuit diagram of the RF transistor amplifier of FIG. 4A. As shown in FIG. 4B, the second metal layer 274 may form an LC circuit that extends from the input RF transmission line 62 to ground. In this particular embodiment, the LC circuit forms an input harmonic termination circuit, but embodiments of the present invention are not limited thereto. As is also shown in FIG. 4B (but not in FIG. 4A), an output matching circuit such as an output impedance matching circuit may additionally (or alternatively) be formed in the second metal layer 274 (or in another metal layer of the multi-layer encapsulation 270). Thus, the multi-layer encapsulation 270 may perform one or more of the following functions: (a) providing RF shielding for the RF transistor amplifier die 10, (b) providing isolation between the input and the output of the RF transistor amplifier die 10, (c) reducing the inductance of the input and/or output bond wires 69 to provide improved matching circuits, and (d) for implementing input and/or output impedance matching and/or harmonic termination circuits.

Figure 5:
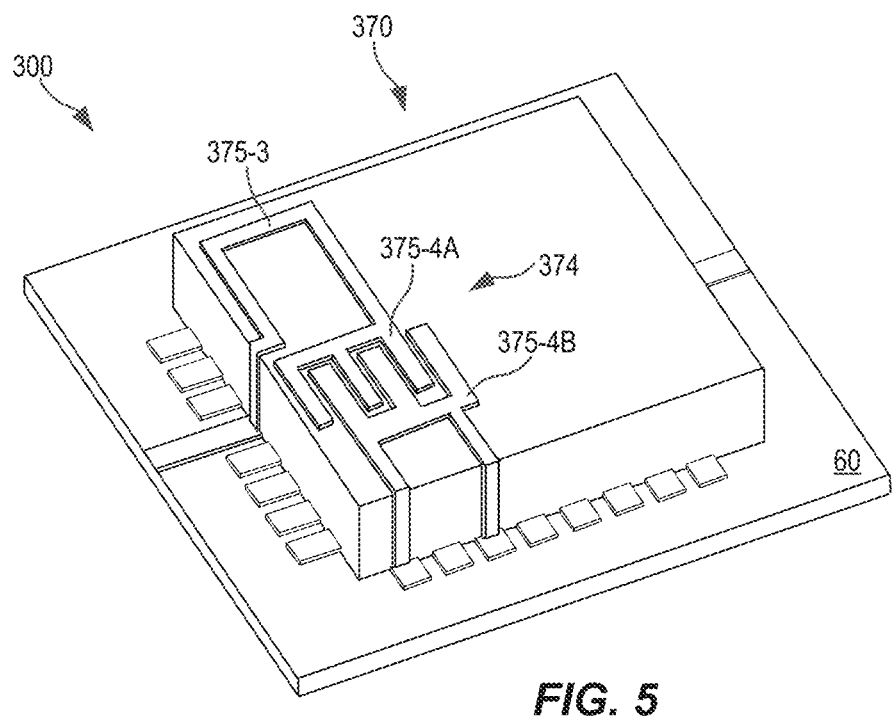
FIG. 5 is a schematic perspective view an RF transistor amplifier mounted on an RF board and protected by a multi-layer encapsulation according to further embodiments of the present invention.

FIG. 5 is a schematic perspective view an RF transistor amplifier 300 according to still further embodiments of the present invention that is mounted on an RF board 60 and protected by a multi-layer encapsulation 370. The multi-layer encapsulation 370 includes at least a first dielectric layer 372 and a second metal layer 374, and may be very similar to multi-layer encapsulation 270. In particular, the second metal layer 374 of multi-layer encapsulation 370 includes the LC circuit that is coupled to the RF input 62, which may be implemented using metal patterns 375-3 and 375-4 which may be basically identical to metal patterns 275-3 and 275-4 of multi-layer encapsulation 270. However, multi-layer encapsulation 370 omits any metal patterns that are similar to metal patterns 275-1 and 275-2 of multi-layer encapsulation 270, and positions the LC circuit over the input region of the RF transistor amplifier die 10

Figure 6:
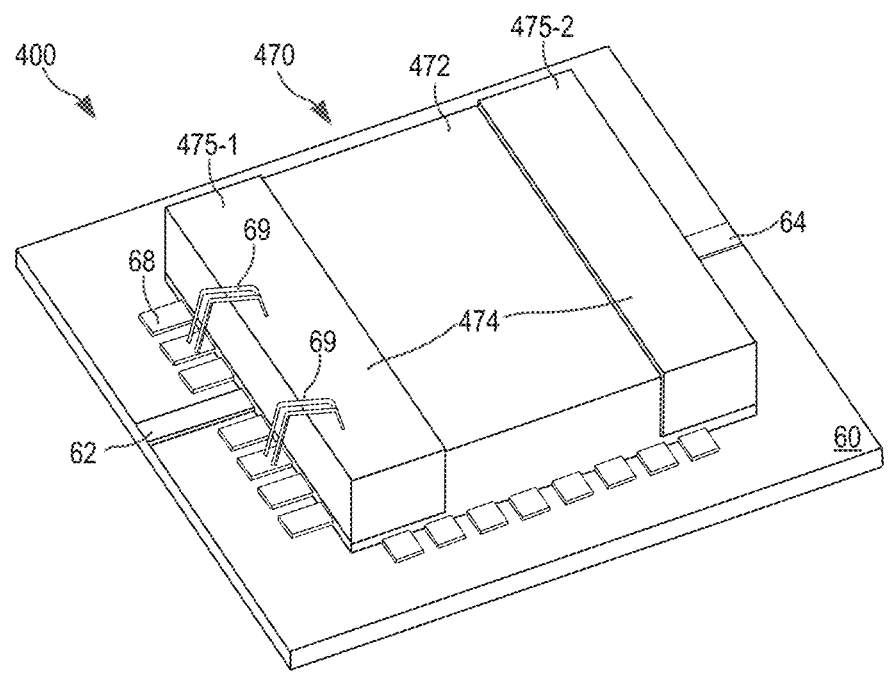
FIG. 6 is a schematic perspective view an RF transistor amplifier mounted on an RF board and protected by a multi-layer encapsulation according to still further embodiments of the present invention.

FIG. 6 is a schematic perspective view an RF transistor amplifier 400 mounted on an RF board 60 and protected by a multi-layer encapsulation 470 according to further embodiments of the present invention. The multi-layer encapsulation 470 is similar to the multi-layer encapsulation 170 of RF transistor amplifier 100 in that it includes a first dielectric layer 472 that encapsulates the RF transistor amplifier 10 and a second metal layer 474 that has first and second metal patterns 475-1, 475-2 that are coupled to ground. The first and second metal patterns 475-1, 475-2 may perform one or more of the functions of (a) providing RF shielding for the RF transistor amplifier die 10, (b) providing isolation between the input and the output of the RF transistor amplifier die, and (c) reducing the inductance of the input and/or output bond wires to provide improved matching circuits. The multi-layer encapsulation 470 differs from the multi-layer encapsulation 170, however, in that the first and second metal patterns 475-1, 475-2 do not extend as far downwardly and hence do not contact the metal pads 68 on the RF board 60. In order to connect the first and second metal patterns 475-1, 475-2 to ground, additional bond wires 69 are provided that extend from the metal pads 68 to the first and second metal patterns 475-1, 475-2 to provide the ground connection.

Figure 7A:
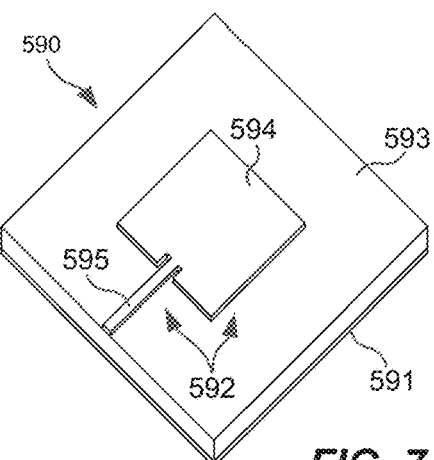
FIG. 7A is a schematic perspective view of a patch antenna element that can be implemented in the multi-layer encapsulations according to embodiments of the present invention.

FIG. 7A is a schematic perspective view of a patch antenna element 590 that can be implemented in the multi-layer encapsulations according to embodiments of the present invention. As shown in FIG. 7A, the conventional patch antenna element 590 comprises first and second metal patterns 591, 592 that are on opposed major surfaces of a dielectric substrate 593. The dielectric substrate 593 may comprise a planar sheet of dielectric material. A thickness and/or dielectric constant of the dielectric material may be selected based on a desired width of the feed line 595 and/or on a desired operating bandwidth for the patch antenna element 590. The first metal pattern 591 comprises a conductive ground plane that is formed on the lower major surface of the dielectric substrate 593. The conductive ground plane 591 may simply be a continuous metal sheet (e.g., a copper layer). The second metal pattern 592 is formed on the upper surface of the dielectric substrate 593 opposite the conductive ground plane 592. The second metal pattern 592 includes a patch radiator 594 and a feed line 595 that is coupled to the patch radiator 594. The patch radiator 594 may have any appropriate shape including square, circular, rectangular, elliptical, etc. In some embodiments, the length and width of the patch radiator 594 may each be about a half of a wavelength of a center frequency of the frequency band in which the patch antenna element 590 is designed to operate. The feed line 595 may connect the patch radiator 594 to a transmission line (not shown) that feeds RF signals to and from the patch antenna element 590.

The patch antenna element 590 includes an inset feed design. With an inset feed design, a portion along a first side of a patch radiator 594 (assuming here a square or rectangular patch radiator that has "sides") is removed (or not formed) to create a recess in the first side. The feed line 595 connects to the patch radiator 594 within this recess so that the connection point between the feed line 595 and the patch radiator 594 appears to be within an "interior" of the patch radiator 594, which may improve the impedance match between the patch radiator 594 and the feed line 595, improving the return loss performance of the patch antenna element 590. Moderate insetting of the feed point typically has little impact on the radiation pattern of the patch antenna element 590. The amount of inset (i.e., how far into the interior of the patch radiator 594 the feed point is inset) may be varied to trade-off the improvement in impedance match versus the impact on the radiation pattern of the patch antenna element 590.

Figure 7B:
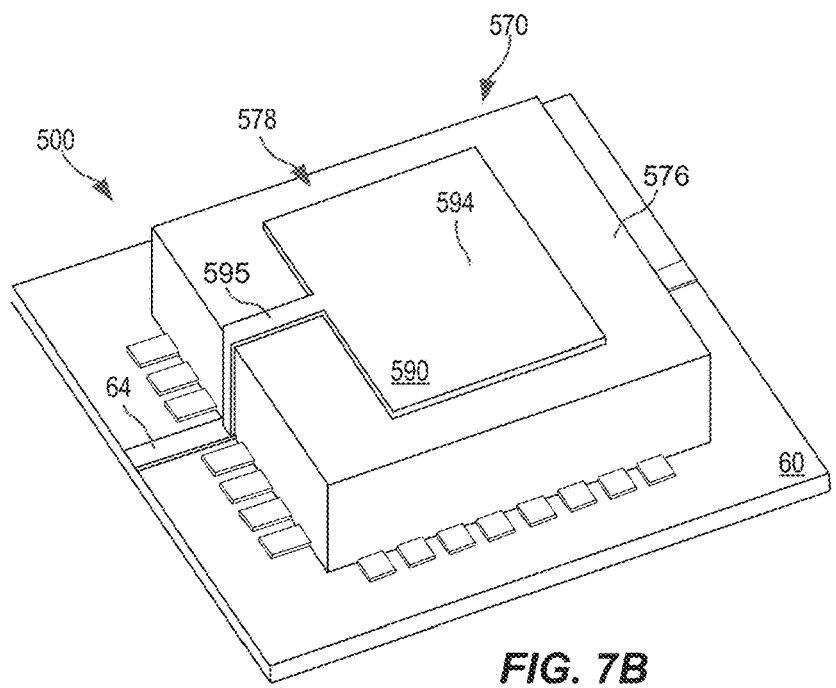
FIG. 7B is a schematic perspective view an RF transistor amplifier mounted on an RF board that includes a multi-layer encapsulation having a patch antenna element fabricated therein.

FIG. 7B is a schematic perspective view an RF transistor amplifier 500 according to further embodiments of the present invention that is mounted on an RF board 60 that includes a multi-layer encapsulation 570 having the patch antenna element 590 of FIG. 7A fabricated therein. The multi-layer encapsulation 570 includes multiple conductive layers in order to implement the patch antenna element 590.

In particular, as shown in FIG. 7B, the multi-layer encapsulation 570 includes a first dielectric layer 572 (FIG. 7C) that may be identical to the first dielectric layer 172 discussed above. A second metal layer 574 (FIG. 7C) is formed on the first dielectric layer 572. The second metal layer 574 may be a square metal pattern 575 that includes an electrical connection (not shown) to one of the metal pads 68. The square metal pattern 575 acts as the ground plane 591 for the patch antenna element 590. A third dielectric layer 576 may cover the second metal layer 574. The third dielectric layer 576 may form the dielectric substrate 593 of the patch antenna element 590. The third dielectric layer 576 may be formed of a low loss dielectric material in some embodiments in order to improve the performance of the patch antenna element 590. A fourth metal layer 578 is formed on the third dielectric layer 576. The fourth metal layer 578 may comprise the patch radiator 594 and feed line 595 of the patch antenna element 590. The feed line 595 may be electrically connected to the RF output (i.e., the drain terminal) of the RF transistor amplifier die 10. The feed line 595 may comprise an RF transmission line and may be implemented as a microstrip transmission line (i.e., the feed line 595, dielectric substrate 593 and ground plane 591 form a microstrip transmission line). The patch radiator 590 may include an inset feed (see FIG. 7A) which is not shown in FIG. 7B to simplify the drawing.

Amplified RF signals that are output at the drain terminal 14 of the RF transistor amplifier die 10 are fed to the patch radiator 594 via the feed line 595. The patch antenna element 590 may then radiate these RF signals. This design advantageously locates the patch antenna element 590 in very close proximity to the RF transistor amplifier die 10, which may reduce the insertion loss of the amplifier to antenna element connection. This design also advantageously reduces the space required to implement the amplifier and antenna element, allowing for product miniaturization.

Figure 7C:
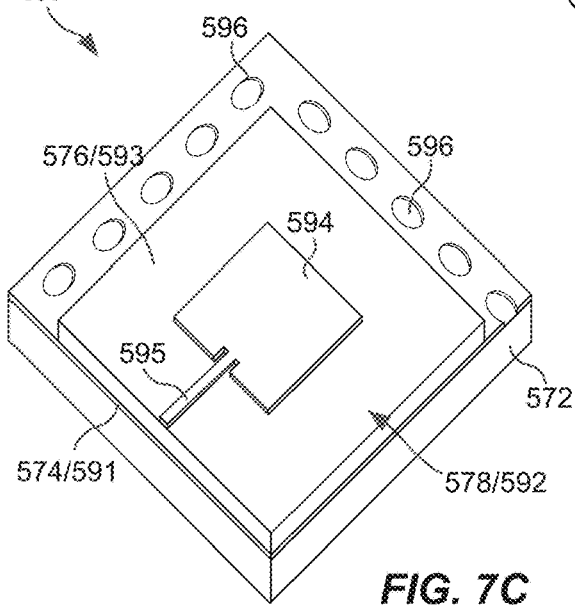
FIG. 7C is a schematic perspective view illustrating how the outer portion of the ground layer of the patch antenna element may include openings to facilitate obtaining good adhesion between layers of the multi-layer encapsulation.

FIG. 7C is a schematic perspective view illustrating how the outer portion of the ground plane 591 of the patch antenna element 590 may include openings 596 to facilitate obtaining good adhesion between layers of the multi-layer encapsulation. In FIG. 7C, only a portion of the third dielectric 576 that forms the dielectric substrate 593 of the patch antenna element 590 is shown to illustrate the openings 596 in the ground plane 591.

The RF transistor amplifier 500 may be particularly useful in active antenna arrays. An active antenna array refers to a phased array of antenna elements in which each antenna element, or sub-groups of antenna elements, are coupled to radio transceivers that can adjust the amplitude and/or phase of the RF signals transmitted through each antenna element or sub-group. The amplitudes and phases may be configured so as to constructively combine in a desired direction to form a narrowed antenna beam having increased gain.

Figure 7D:
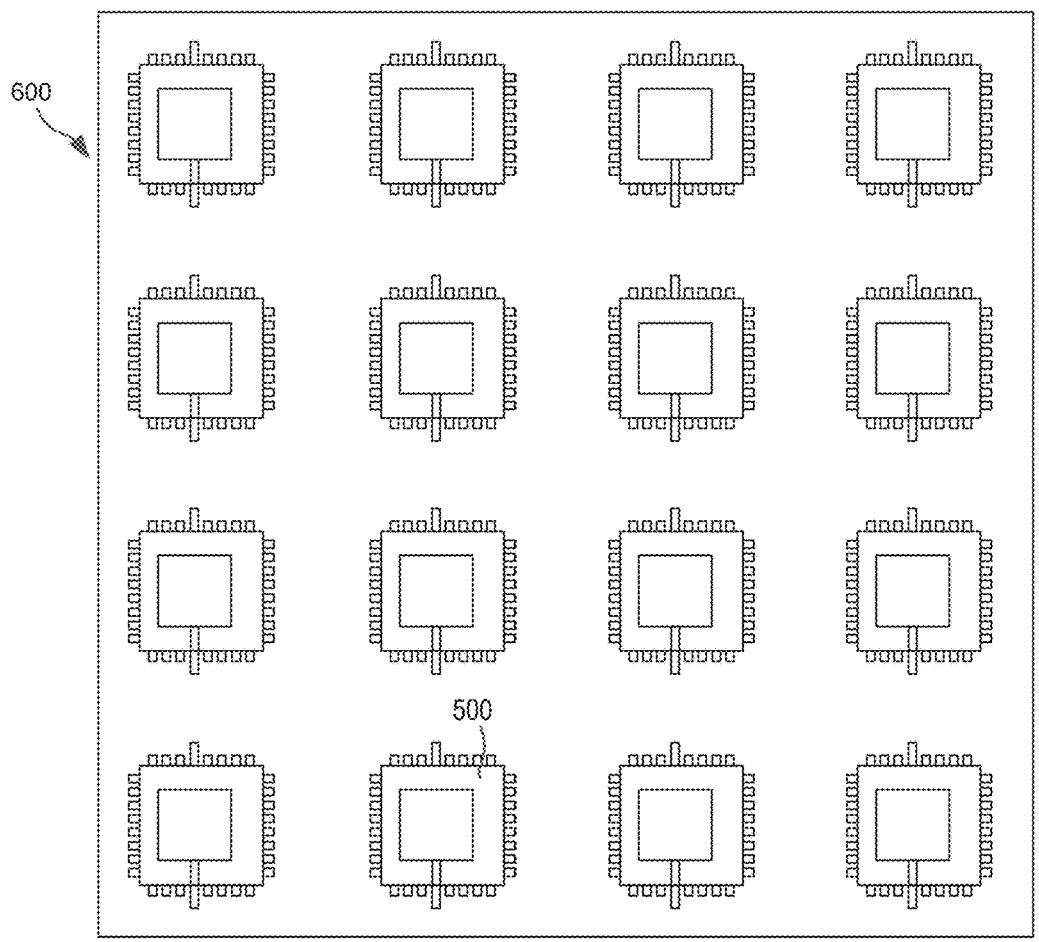
FIG. 7D is a front perspective view of an antenna array that is suitable for use as a massive MIMO or beamforming array that may be formed using the RF transistor amplifiers of FIG. 7B.

FIG. 7D is a schematic front view of an active antenna array 600 that is suitable for use as a massive MIMO or beamforming array that may be formed using the RF transistor amplifiers 500 of FIG. 7B. In the example embodiment illustrated in FIG. 7B, the phased array antenna 600 includes a total of sixteen RF transistor amplifiers 500 which are arranged in a 4×4 array. The array may include RF circuitry which may generate RF signals based on baseband data that have appropriate amplitudes and phases for generating an antenna beam that points in a desired direction. The RF transistor amplifiers 500 may set the amplitude for the transmitted RF signals. The transmission lines on the RF board are mostly not shown to simplify the drawing.

Figure 8:
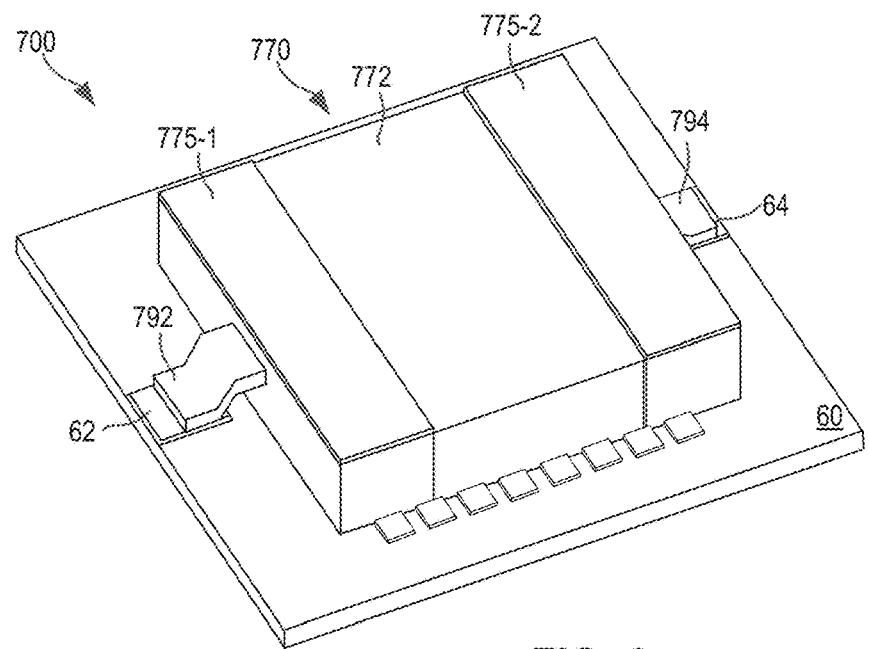
FIG. 8 is a schematic perspective view a lead frame based RF transistor amplifier according to embodiments of the present invention that includes a multi-layer encapsulation that may have functional electrical circuits embedded therein.

FIG. 8 is a perspective view of a lead frame based RF transistor amplifier 700 according to further embodiments of the present invention that includes a multi-layer encapsulation that may have functional electrical circuits embedded therein. The RF transistor amplifier 700 may include an RF transistor amplifier die 10 that is mounted on a submount 53 and a plurality of leads attached (e.g., by soldering) thereto. The leads may connect to external circuits, and may include an RF input lead 792 and an RF output lead 794. A multi-layer encapsulation 770 may be formed to cover the RF transistor amplifier die and a top surface of the submount 53. The multi-layer encapsulation 770 may include a first dielectric layer 772 in the form of, for example, a plastic encapsulation that covers the exposed surfaces of the RF transistor amplifier die 10. The multi-layer encapsulation 770 may further include a second metal layer having patterns 775-1, 775-2 in which a functional electrical circuit is implemented such as any of the example functional electrical circuits disclosed herein. In the example of FIG. 8, the functional electrical circuit comprises RF shields that are formed over the input and output of the RF transistor amplifier die 10. The multi-layer encapsulation 770 may further include an optional third layer of plastic overmold material that encapsulates the second layer. FIG. 8 illustrates that the multi-layer encapsulations having functional electrical circuits therein may be implemented with lead frame based RF transistor amplifiers.

Figure 9:
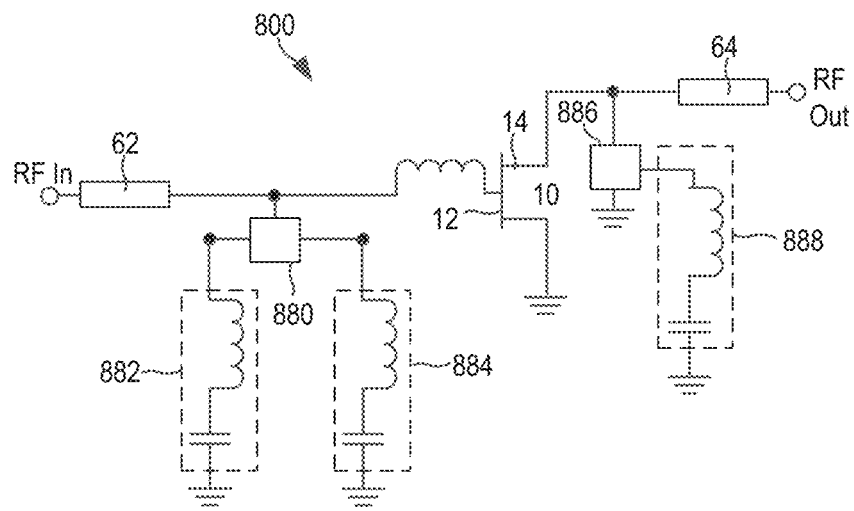
FIG. 9 is a circuit diagram of an RF transistor amplifier according to still further embodiments of the present invention that includes switchable matching circuits.

FIG. 9 is a circuit diagram of an RF transistor amplifier 800 according to still further embodiments of the present invention that includes switchable matching circuits. The matching circuits may be formed in a multi-layer encapsulation 870 of the RF transistor amplifier 800.

As shown in FIG. 9, the RF transistor amplifier 800 includes an RF transistor amplifier die 10. A gate terminal 12 of the RF transistor amplifier die 10 is connected to an input transmission line 62, which may comprise, for example, a transmission line on an RF board. A first switch 880 is coupled to the RF transmission line that connects the input transmission line 62 to the gate terminal 12. First and second matching circuits 882, 884 are coupled to the outputs of the first switch 880. The switch 880 may be set to couple one of the two matching circuits 882, 884 between the input transmission line 62 and ground. The first and second matching circuits 882, 884 may each be implemented in the multi-layer encapsulation in the manner described above. The RF transistor amplifier 800 may be configurable to operate over an operating frequency band that includes two sub-bands. The first matching circuit 882 may be configured, for example, to match the input impedance of the RF transistor amplifier 10 to the impedance of the input transmission line 62 when the RF transistor amplifier is fed with RF signals in the first sub-band, while the second matching circuit 884 may be configured to match the input impedance of the RF transistor amplifier 10 to the impedance of the input transmission line 62 when the RF transistor amplifier is fed with RF signals in the second sub-band. The switch 880 may be set based on the sub-band. The switch 880 may be implemented, for example, on the RF board 60. As another example, the RF transistor amplifier 800 further includes a second switch 886. The second switch 886 may be used to selectively couple an output matching network 888 to the connection between the drain terminal 14 of RF transistor amplifier die 10 and an output transmission line 64. Once again, the output matching network 888 may be implemented in the multi-layer encapsulation in the manner described above. Thus, FIG. 9 illustrates additional examples as to how functional electrical circuits may be implemented in the multi-layer encapsulations according to embodiments of the present invention and electrically connected to an RF transistor amplifier die 10 that is protected by the multi-layer encapsulation.

Figure 10:
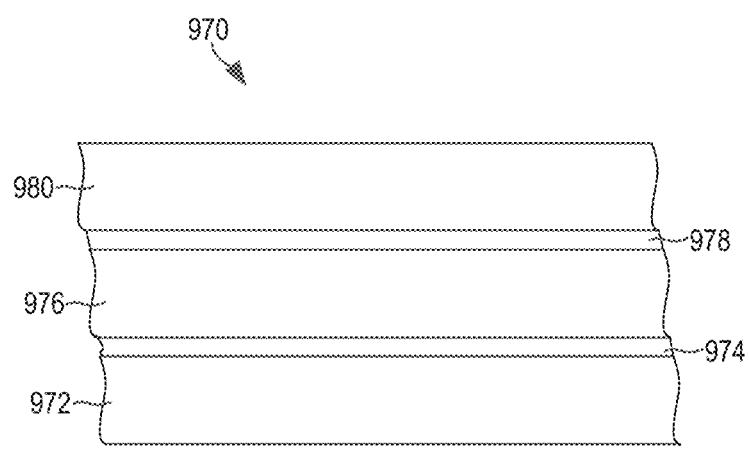
FIG. 10 is a block diagram of a portion of a multi-layer encapsulation according to still further embodiments of the present invention that includes a variable capacitor implemented therein.

FIG. 10 is a schematic diagram of a portion of multi-layer encapsulation 970 according to still further embodiments of the present invention. The multi-layer encapsulation 970 includes a variable capacitor that may, for example, be part of a matching network of an RF transistor amplifier die 10 that is protected by the multi-layer encapsulation 970. As shown in FIG. 10, the multi-layer encapsulation 970 may include at least five layers. The first layer 972 may comprise a plastic overmold material that covers and protects an underlying RF transistor amplifier die 10 (not shown). The second layer 974 may comprise a metal pattern that includes a lower metal plate (electrode) of a variable plate capacitor that is implemented in the multi-layer encapsulation 970. The third layer 976 may comprise a dielectric layer that forms the dielectric of the variable capacitor. The third layer may comprise, for example, a barium strontium titanate or other dielectric material that has a dielectric constant that changes significantly based on a direct current voltage applied across the dielectric layer. The fourth layer 978 may comprise another metal pattern that includes an upper metal plate (electrode) of the variable plate capacitor. Finally, the fifth layer 980 may comprise a plastic overmold material. The second and fourth layers may further include transmission lines (not shown) that connect to the respective metal plates implemented in those layers. Different direct current bias voltages may be applied across the third layer 976 in order to vary the dielectric constant thereof, thereby implementing a variable capacitor in the multi-layer encapsulation 970. The variable capacitor may comprise, for example, a capacitor of an impedance matching network or a harmonic termination circuit in example embodiments.

Figure 11:
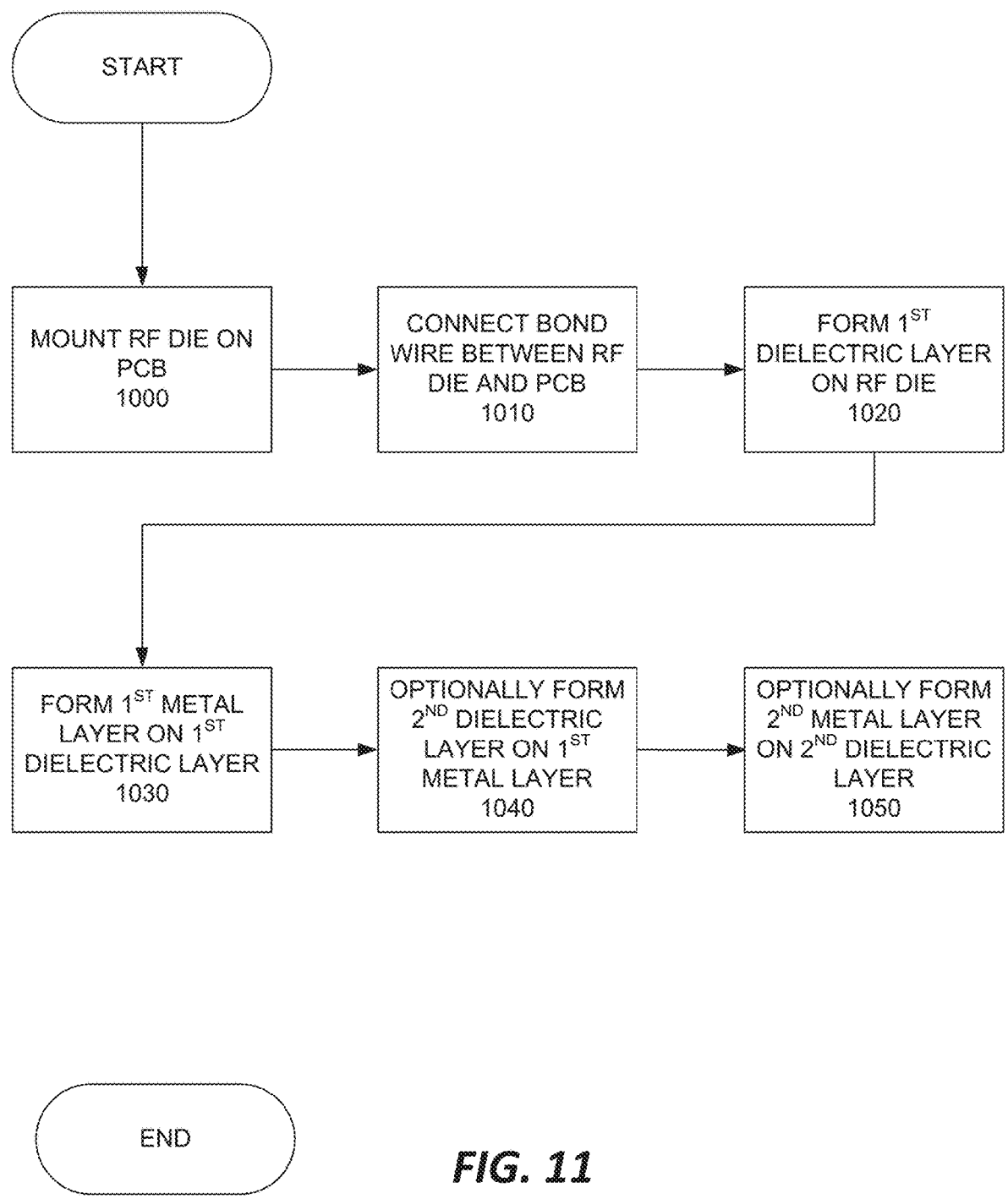
FIG. 11 is a flow chart illustrating a method of fabricating an RF transistor amplifier.

FIG. 11 is a flow chart illustrating a method according to embodiments of the present invention of fabricating an RF transistor amplifier. As shown in FIG. 11, an RF transistor amplifier die is mounted on a printed circuit board (Block 1000). A bond wire is connected between the printed circuit board and a terminal of the RF transistor amplifier die (Block 1010). A first dielectric layer of a multi-layer encapsulation is formed on the RF transistor amplifier die (Block 1020). The first dielectric layer may fully encapsulate the bond wire and may at least partially encapsulate the RF transistor amplifier die. A first conductive layer of the multi-layer encapsulation is formed on the first dielectric layer (Block 1030). The first conductive layer is part of an electrical circuit. A second dielectric layer of the multi-layer encapsulation may optionally be formed on the first conductive layer (Block 1040). An optional second metal layer of the multi-layer encapsulation may also optionally be formed on the second dielectric layer (Block 1050). The second metal layer, if provided, may be electrically connected to the RF board and/or to the first metal layer, or may be electrically floating. The first and second metal layers may supplement each other (e.g., form a plate capacitor or an antenna element) or may serve different functions (e.g., the first metal layer may include reactive elements and the second metal layer may comprise a floating or electrically grounded RF isolation shield). One or more of the metal layers may be coupled to ground or to the input or output of an RF amplifier die. The dielectric layers may comprise overmold plastic and/or other materials (e.g., specialized dielectric materials for the dielectric layers of capacitors or patch antenna elements). One or more additional operations may be performed such as, for example, forming one or more additional conductive layers and/or dielectric layers of the multi-layer encapsulation. The electrical circuit may comprise any of the electrical circuits described above.

It will be appreciated that the multi-layer encapsulations according to embodiments of the present invention may be overmold encapsulations that directly contact the RF transistor amplifier die and/or bond wires that make electrical connections to the RF transistor amplifier die. The conductive layers of these multi-layer encapsulations may be thin metal layers that are formed directly on dielectric layer of the multi-layer encapsulations.

The RF transistor amplifiers according to embodiments of the present invention may be designed to operate in a wide variety of different frequency bands. In some embodiments, the RF transistor amplifiers may be configured to operate at frequencies greater than 1 GHz. In other embodiments, these RF transistor amplifier dies may be configured to operate at frequencies greater than 2.5 GHz. In still other embodiments, the RF transistor amplifier dies may be configured to operate at frequencies greater than 3.1 GHz. In yet additional embodiments, these RF transistor amplifier dies may be configured to operate at frequencies greater than 5 GHz. In some embodiments, these RF transistor amplifier dies may be configured to operate in at least one of the 2.5-2.7 GHz, 3.4-4.2 GHz, 5.1-5.8 GHz, 12-18 GHz, 18-27 GHz, 27-40 GHz or 40-75 GHz frequency bands or sub-portions thereof.

Although embodiments of the present invention have been discussed above with respect to a RF transistor amplifier dies that are implemented using HEMT devices, it will be understood that other types of semiconductor devices may be formed in the semiconductor layer structure without deviating from the present invention. For example, the semiconductor layer structure may include a MOSFET, a DMOS transistor, a MESFET, and/or an LDMOS transistor in other embodiments.

Figure 12:
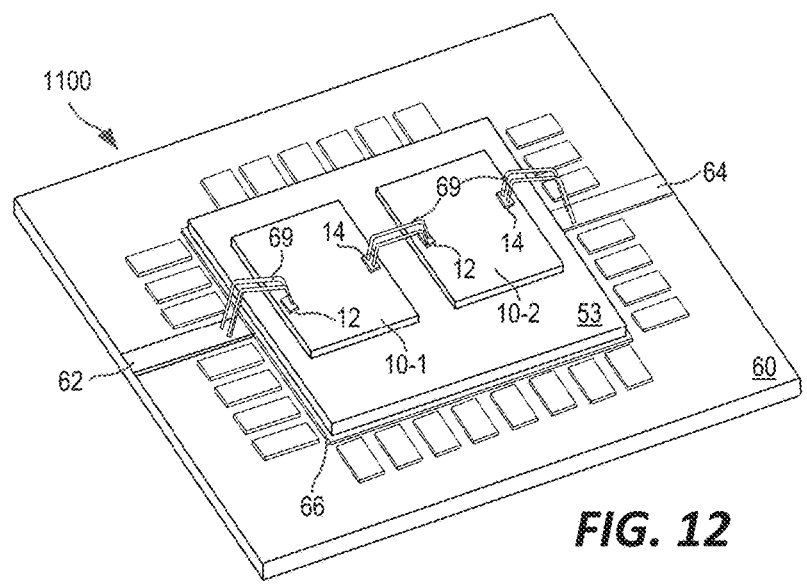
FIG. 12 is a schematic perspective view of a pair of RF transistor amplifier die mounted on an RF board that may be encapsulated with the multi-layer encapsulations according to embodiments of the present.

It will also be appreciated that the multi-layer encapsulation package structures according to embodiments of the present invention may be used with any kind of RF transistor amplifier die. For example, the RF transistor amplifier die may comprise a discrete RF transistor amplifier die, a monolithic microwave integrated circuit RF transistor amplifier die (e.g., that has impedance matching and/or harmonic termination circuits implemented at the semiconductor die level so that these circuits are part of the RF transistor amplifier die), or something in between. The RF transistor amplifier die may include a single RF transistor amplifier circuit or multiple RF transistor amplifier circuits. If multiple RF transistor amplifier circuits are provided, they may be arranged in series and/or in parallel. Likewise, the RF transistor amplifiers according to embodiments of the present invention may include a single RF transistor amplifier die or multiple RF transistor amplifier die mounted within the multi-layer encapsulation. For example, FIG. 12 is a schematic perspective view that illustrates an RF transistor amplifier 1100 according to further embodiments of the present invention in which a first stage RF transistor amplifier die 10-1 and a second stage RF transistor amplifier die 10-2 are connected in series. The view of FIG. 12 is before the multi-layer encapsulation is applied (i.e., it corresponds to the view of FIG. 3A). It will be appreciated that any of the multi-layer encapsulations disclosed herein may be applied to the RF transistor amplifier die 1100 of FIG. 12.

Figure 13A:
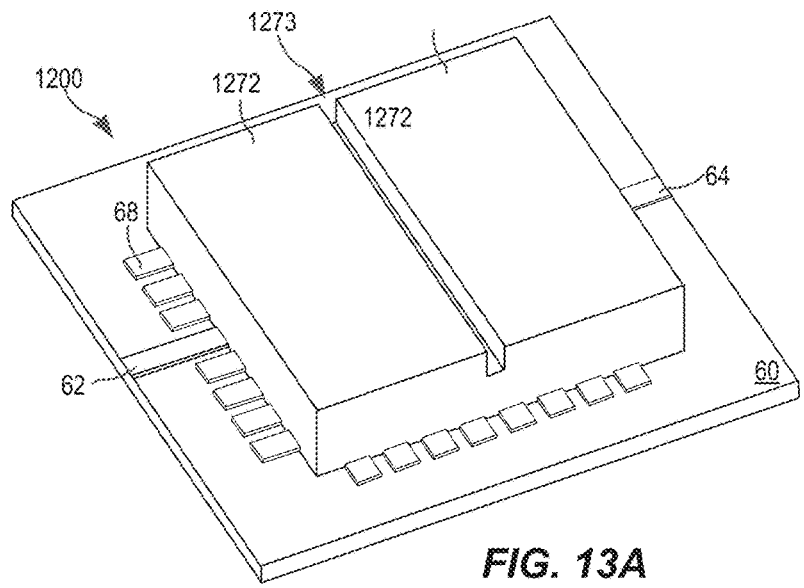
FIGS. 13A and 13B are schematic perspective views that illustrate an RF transistor amplifier according to still further embodiments of the present invention.
Figure 13B:
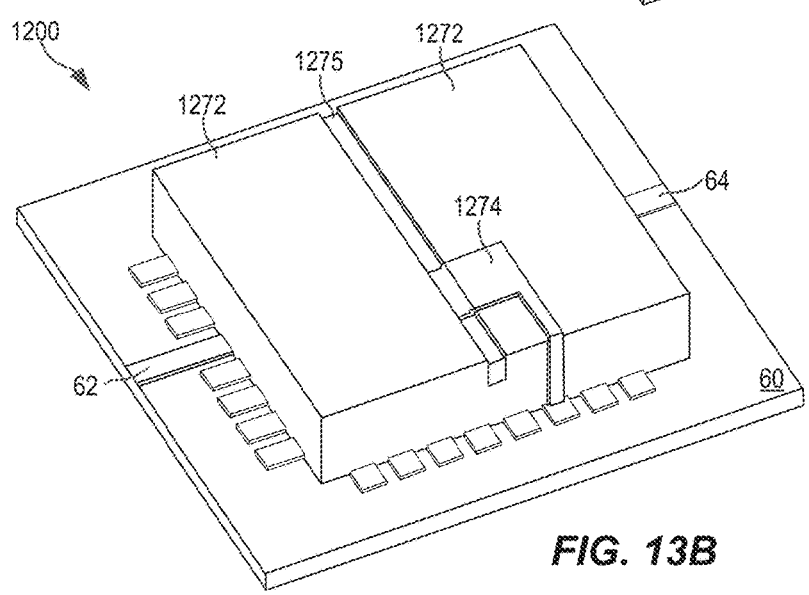

FIGS. 13A and 13B are schematic perspective views that illustrate an RF transistor amplifier 1200 according to further embodiments of the present invention. The RF transistor amplifier 1200 may be formed in the manner described above with respect to FIGS. 3A and 3B so that an RF transistor amplifier die 10 is mounted on an RF board and a dielectric encapsulation layer 1272 (corresponding to layer 172 in FIG. 3B) is formed to cover the RF transistor amplifier die 10. As shown in FIG. 13A, one or more grooves (or other cavities) 1273 are formed in dielectric encapsulation layer 1272. In the example embodiment of FIGS. 13A-13B, a single groove 1273 is formed. The groove (or other cavity) 1273 may be formed, for example, through overmolding, cutting, sawing, etching or any other appropriate process for removing (or omitting) a portion of dielectric encapsulation layer 1272. Them as shown in FIG. 13B, a conductive material 1275 (e.g., copper or another metal) may be deposited in the groove 1273 (or other cavity). The metal pattern 1275 in the depicted embodiment may, for example, serve as an RF shield between the input and output of the RF transistor amplifier die 10 (and between the associated bond wire connections thereto). The metal pattern 1275 may, for example, be connected to one of the metal pads 68 on the RF board 60 by bond wires (not shown). Alternatively, as shown in FIG. 13B, a first metal layer 1274 may be formed on the encapsulation 1270 that extends between the metal pattern 1275 and one of the metal pads 68 to provide a ground connection to the metal pattern 1275. In such an embodiment, a second dielectric layer (not shown) may be formed over the first metal layer 1274 in the manner discussed above.

It will be appreciated that a wide variety of different grooves or cavities may be used. For example, in another embodiment, a groove (not shown) may be provided in the dielectric encapsulation layer 1272 that is rotated ninety degrees from the groove 1273 illustrated in FIGS. 13A-13B so that the groove extends parallel to an axis that connects the RF input 62 to the RF output 64. This groove could be used in an RF transistor amplifier that includes multiple paths between the input and output to provide RF shielding/isolation between two of the paths, such as in an amplifier having a Doherty configuration.

Embodiments of the present inventive concepts have been described above with reference to the accompanying drawings, in which embodiments of the invention are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A radio frequency ("RF") transistor amplifier, comprising:
   a submount;
   an RF transistor amplifier die mounted on top of the submount; and
   a multi-layer encapsulation that at least partially covers the RF transistor amplifier die,
   wherein the multi-layer encapsulation includes a first dielectric layer and a first conductive layer,
   wherein the first dielectric layer is between a top surface of the RF transistor amplifier die and the first conductive layer, and
   wherein the first dielectric layer is on a side surface of the RF transistor amplifier die.

2. A radio frequency ("RF") transistor amplifier, comprising:
   a submount;
   an RF transistor amplifier die mounted on top of the submount; and
   a multi-layer encapsulation that at least partially covers the RF transistor amplifier die,
   wherein the multi-layer encapsulation includes a first dielectric layer and a first conductive layer,
   wherein the first dielectric layer is between a top surface of the RF transistor amplifier die and the first conductive layer,
   wherein the multi-layer encapsulation further includes a second dielectric layer, and wherein at least part of the first conductive layer is sandwiched between the first dielectric layer and the second dielectric layer.

3. A radio frequency ("RF") transistor amplifier, comprising:
   a submount;
   an RF transistor amplifier die mounted on top of the submount; and
   a multi-layer encapsulation that at least partially covers the RF transistor amplifier die,
   wherein the multi-layer encapsulation includes a first dielectric layer and a first conductive layer,
   wherein the first dielectric layer is between a top surface of the RF transistor amplifier die and the first conductive layer,
   wherein the first conductive layer is positioned to reduce coupling between an RF input connection to the RF transistor amplifier die and an RF output connection to the RF transistor amplifier die.

4. The RF transistor amplifier of claim 1, wherein the first conductive layer is configured to reduce an inductance of a bond wire connection to the RF transistor amplifier die.

5. The RF transistor amplifier of claim 1, wherein the first conductive layer comprises an antenna element that is electrically coupled to an output of the RF transistor amplifier die.

6. The RF transistor amplifier of claim 1, wherein the RF transistor amplifier is mounted on an RF board, and the first conductive layer is electrically connected to the RF board.

7. A radio frequency ("RF") transistor amplifier, comprising:
   an RF transistor amplifier die; and
   an encapsulation that at least partially encapsulates the RF transistor amplifier die,
   wherein the encapsulation includes a first dielectric layer that at least partially encapsulates the RF transistor amplifier die and an electrical circuit that is formed on the first dielectric layer opposite the RF transistor amplifier die, and
   wherein the electrical circuit includes at least one of a capacitor, an inductor, and/or an antenna element.

8. The RF transistor amplifier of claim 7, wherein the electrical circuit comprises an impedance matching circuit.

9. The RF transistor amplifier of claim 7, wherein the electrical circuit comprises an interdigitated finger capacitor.

10. A radio frequency ("RF") transistor amplifier, comprising:
    an RF transistor amplifier die; and an encapsulation that at least partially encapsulates the RF transistor amplifier die, wherein the encapsulation includes a first dielectric layer that at least partially encapsulates the RF transistor amplifier die and an electrical circuit that is formed on the first dielectric layer opposite the RF transistor amplifier die, wherein the electrical circuit comprises a grounded conductive layer that is positioned to reduce coupling between an RF input connection to the RF transistor amplifier die and an RF output connection to the RF transistor amplifier die.

11. The RF transistor amplifier of claim 10, wherein the encapsulation further includes a first conductive layer, and wherein at least part of the electrical circuit is implemented in the first conductive layer.

12. The RF transistor amplifier of claim 11, wherein the first conductive layer is configured to reduce coupling between the RF input connection and the RF output connection.

13. A radio frequency ("RF") transistor amplifier, comprising:

an RF transistor amplifier die; and an encapsulation that at least partially encapsulates the RF transistor amplifier die, wherein the encapsulation includes a first dielectric layer that at least partially encapsulates the RF transistor amplifier die and an electrical circuit that is formed on the first dielectric layer opposite the RF transistor amplifier die, wherein the electrical circuit in the encapsulation is electrically connected to an external circuit through at least one bond wire.

14. The RF transistor amplifier of claim 7, wherein the electrical circuit comprises the antenna element, and the antenna element is electrically coupled to an output of the RF transistor amplifier die.

15. A radio frequency ("RF") transistor amplifier, comprising:

an RF transistor amplifier die;

a plurality of bond wires electrically connecting the RF transistor amplifier die to an external circuit; and a multi-layer encapsulation that at least partially encapsulates the RF transistor amplifier die, wherein the multi-layer encapsulation includes a grounded conductive layer positioned immediately adjacent at least one of the bond wires.

16. The RF transistor amplifier of claim 15, wherein the grounded conductive layer is configured to reduce coupling between an input and an output of the RF transistor amplifier.

17. The RF transistor amplifier of claim 15, wherein the grounded conductive layer is configured to reduce an inductance of a bond wire connection to the RF transistor amplifier die.

18. The RF transistor amplifier of claim 15, wherein the multi-layer encapsulation includes a first dielectric layer that at least partially encapsulates the RF transistor amplifier die and the grounded conductive layer is on the first dielectric layer opposite the RF transistor amplifier die.

19. The RF transistor amplifier of claim 18, wherein the grounded conductive layer extends along a sidewall of the first dielectric layer to physically contact a metal pad on an underlying printed circuit board.

20. The RF transistor amplifier of claim 15, wherein the grounded conductive layer includes a first metal pattern that extends above an input terminal of the RF transistor amplifier die and a second metal pattern that extends above an output terminal of the RF transistor amplifier die.

* * * * *

UNITED STATES PATENT AND TRADEMARK OFFICE
CERTIFICATE OF CORRECTION

| | | |
|---|---|---|
| PATENT NO. | : 11,677,362 B2 | Page 1 of 1 |
| APPLICATION NO. | : 17/085367 | |
| DATED | : June 13, 2023 | |
| INVENTOR(S) | : Brewer et al. | |

It is certified that error appears in the above-identified patent and that said Letters Patent is hereby corrected as shown below:

In the Specification

Column 11, Line 59: Please correct "Al or" to read --AlN or--

Signed and Sealed this
Eighth Day of August, 2023

Katherine Kelly Vidal
*Director of the United States Patent and Trademark Office*